(12) United States Patent
Aoyama et al.

(10) Patent No.: US 10,998,870 B2
(45) Date of Patent: May 4, 2021

(54) INFORMATION PROCESSING APPARATUS, INFORMATION PROCESSING METHOD, AND PROGRAM

(71) Applicant: SONY CORPORATION, Tokyo (JP)

(72) Inventors: Keiichi Aoyama, Tokyo (JP); Satoshi Suzuki, Tokyo (JP); Koji Furusawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/761,106

(22) PCT Filed: Oct. 26, 2018

(86) PCT No.: PCT/JP2018/039838
§ 371 (c)(1),
(2) Date: May 1, 2020

(87) PCT Pub. No.: WO2019/093155
PCT Pub. Date: May 16, 2019

(65) Prior Publication Data
US 2020/0358415 A1     Nov. 12, 2020

(30) Foreign Application Priority Data

Nov. 10, 2017    (JP) .............................. JP2017-217215

(51) Int. Cl.
*H03G 3/20*      (2006.01)
*H04N 21/439*      (2011.01)
(Continued)

(52) U.S. Cl.
CPC ........... *H03G 3/20* (2013.01); *H04N 21/4394* (2013.01); *H04N 21/44008* (2013.01); *H04N 21/4852* (2013.01); *H04S 7/301* (2013.01)

(58) Field of Classification Search
CPC ......... H04N 21/47217; H04N 21/4728; H04N 5/23296; H04N 21/4394; H04N 21/44008;
(Continued)

(56) References Cited

U.S. PATENT DOCUMENTS

2010/0026809 A1*    2/2010    Curry ................. H04N 5/23238
348/157

FOREIGN PATENT DOCUMENTS

EP          1035732     *    9/2000
JP          2006109295    *    4/2006

* cited by examiner

*Primary Examiner* — Norman Yu
(74) *Attorney, Agent, or Firm* — Paratus Law Group, PLLC

(57) ABSTRACT

There is provided an information processing apparatus, an information processing method, and a program that enable output of a sound to be heard at an assumed viewing/listening position of a zoom image when an image is displayed as the zoom image. In the case of image content such as a sports broadcast, the individual location information, direction and posture information, and audio data of each player as an object are stored separately for direct sound and reverberant sound, at the time of recording. At the time of reproducing a zoom image, the direct sound and the reverberant sound are mixed according to the direction of a player as an object with respect to an assumed viewing/listening position in the zoom image, so that a sound to be heard at the assumed viewing/listening position is output. The present disclosure can be applied to a content reproduction apparatus.

12 Claims, 16 Drawing Sheets

(51) Int. Cl.
*H04N 21/44* (2011.01)
*H04N 21/485* (2011.01)
*H04S 7/00* (2006.01)

(58) Field of Classification Search
CPC ....... H04N 21/4852; H04S 7/30; H04S 7/301; H04S 2400/13; H04S 2400/11; H03G 3/20
USPC ...... 381/97–98, 107, 306, 63, 102, 104, 106
See application file for complete search history.

INFORMATION PROCESSING APPARATUS, INFORMATION PROCESSING METHOD, AND PROGRAM

CROSS REFERENCE TO PRIOR APPLICATION

This application is a National Stage Patent Application of PCT International Patent Application No. PCT/JP2018/039838 (filed on Oct. 26, 2018) under 35 U.S.C. § 371, which claims priority to Japanese Patent Application No. 2017-217215 (filed on Nov. 10, 2017), which are all hereby incorporated by reference in their entirety.

TECHNICAL FIELD

The present disclosure relates to an information processing apparatus, an information processing method, and a program, and particularly, to an information processing apparatus, an information processing method, and a program that enable reproduction of a sound to be heard at a viewing/listening position corresponding to an image displayed as a zoom image when an instruction to display the reproduced image as the zoom image is given.

BACKGROUND ART

With the advance of imaging technology, the resolution of an image to be captured has been increased, so that even if a part of a captured image is displayed as a zoom image, image quality is not significantly reduced.

For this reason, when reproducing a captured image, it is possible to achieve viewing/listening while displaying a part of the captured image as a zoom image.

Meanwhile, there has been proposed a technique of displaying an image of a partial region cut out from a wide-angle image relating to a point specified by a user operation in a bird's-eye view image (see Patent Document 1).

According to the technique of Patent Document 1, the partial region cut out from the wide-angle image is variable according to a direction specified by a user operation in the bird's-eye view image. Thus, the user can actively move in the scenery on the basis of the bird's-eye view image.

Therefore, it is conceivable that the technique of Patent Document 1 is applied to a high-resolution image so that any desired range in the image is displayed as a zoom image and provided for viewing/listening.

CITATION LIST

Patent Document

Patent Document 1: Japanese Patent Application Laid-Open No. 2007-109205

SUMMARY OF THE INVENTION

Problems to be Solved by the Invention

As a result of applying the technique of Patent Document 1, it is possible to display a zoom image by using a partial range of the high-resolution image. However, it is not possible to reproduce a sound such that the sound being reproduced corresponds to the zoom image being displayed.

For this reason, even if the image can be reproduced as a zoom image, a sound to be reproduced is the same as that corresponding to the entire image originally displayed before zooming. Thus, there has been a possibility that a divergence may occur between a subject visually recognized and a subject aurally recognized and this may cause a sense of discomfort.

The present disclosure has been made in view of such circumstances, and is particularly intended to enable output of a sound corresponding to an image displayed as a zoom image in a case where there is given an instruction to display the reproduced image as the zoom image.

Solutions to Problems

An information processing apparatus according to an aspect of the present disclosure includes: an image reproduction unit that reproduces image content for which a viewing zoom magnification can be changed; a gain adjustment unit that adjusts volume gain for audio data associated with an object in the image content, according to a viewing zoom magnification during reproduction of the image content and information on a direction that the object faces in the image content; and an audio reproduction unit that reproduces the audio data adjusted by the gain adjustment unit together with the image content.

The gain adjustment unit may be configured to adjust the volume gain of direct sound data and reverberant sound data in the audio data.

The gain adjustment unit may be configured to adjust the volume gain by adjusting a mixing ratio of the direct sound data to the reverberant sound data in the audio data on the basis of the information on the direction that the object faces in the image content, the information being associated with the object.

The gain adjustment unit may be configured to adjust the volume gain by adjusting the mixing ratio of the direct sound data to the reverberant sound data in the audio data on the basis of the information on the direction that the object faces in the image content, the information being associated with the object, when the object in the image content is not facing a viewer/listener.

The gain adjustment unit may be configured to adjust the volume gain by making adjustment such that the mixing ratio of the direct sound data to the reverberant sound data in the audio data is substantially 1:0, on the basis of the information on the direction that the object faces in the image content, the information being associated with the object, when the object in the image content is facing a viewer/listener.

The gain adjustment unit may be configured to adjust the mixing ratio such that a proportion of the direct sound data is increased and a proportion of the reverberant sound data is reduced as the object in the image content faces a direction closer to a direction of a viewer/listener, and adjust the mixing ratio such that the proportion of the direct sound data is reduced and the proportion of the reverberant sound data is increased as the object in the image content faces a direction closer to a direction opposite to the viewer/listener.

The apparatus may further include a proximity object determination unit that determines that there is a plurality of objects in proximity to each other within a predetermined range of the image content, in which the gain adjustment unit may be configured to adjust volume gain of audio data associated with the plurality of objects, on the basis of a result of determination made by the proximity object determination unit.

The gain adjustment unit may be configured to adjust the volume gain by adjusting mixing ratios of the direct sound data to the reverberant sound data of the respective audio data associated with the plurality of objects on the basis of the result of determination made by the proximity object determination unit, obtaining an average value of the mixing ratios of the direct sound data to the reverberant sound data, and treating the average value of the mixing ratios of the direct sound data to the reverberant sound data as a mixing ratio of the direct sound data to the reverberant sound data of audio data associated with a single object.

The direct sound data and the reverberant sound data may be separated at the time of recording the audio data.

The apparatus may further include a terminal to be attached to the object at the time of the recording, in which the terminal may include: an audio data detection unit that detects audio data; a location information detection unit that detects location information; and a direction detection unit that detects a direction that an object faces, and the audio data detected by the audio data detection unit may be separated into the direct sound data and the reverberant sound data.

A viewpoint location of the image content can be changed.

The object may be an object to be displayed in a display area of the image content, the display area being determined by the viewpoint location.

An information processing method according to an aspect of the present disclosure includes: an image reproduction process of reproducing image content for which a viewing zoom magnification can be changed; a gain adjustment process of adjusting volume gain for audio data associated with an object in the image content, according to a viewing zoom magnification during reproduction of the image content and information on a direction that the object faces in the image content; and an audio reproduction process of reproducing the audio data adjusted by the gain adjustment process together with the image content.

A program according to an aspect of the present disclosure is a program for causing a computer to function as: an image reproduction unit that reproduces image content for which a viewing zoom magnification can be changed; a gain adjustment unit that adjusts volume gain for audio data associated with an object in the image content, according to a viewing zoom magnification during reproduction of the image content and information on a direction that the object faces in the image content; and an audio reproduction unit that reproduces the audio data adjusted by the gain adjustment unit together with the image content.

According to an aspect of the present disclosure, there is reproduced image content for which a viewing zoom magnification can be changed; volume gain for audio data associated with an object in the image content is adjusted according to a viewing zoom magnification during reproduction of the image content and information on a direction that the object faces in the image content; and the adjusted audio data are reproduced together with the image content.

Effects of the Invention

According to an aspect of the present disclosure, it is possible, in particular, to output of a sound corresponding to an image displayed as a zoom image in a case where there is given an instruction to display the reproduced image as the zoom image.

MODE FOR CARRYING OUT THE INVENTION

A preferred embodiment of the present disclosure will be described in detail below with reference to the accompanying drawings. Note that in the present specification and the drawings, the same reference signs are assigned to constituent elements having substantially the same functional configuration, and duplicate description will be thus omitted.

Modes for carrying out the present technology will be described below. Note that description will be provided in the following order.

1. Outline of Present Disclosure
2. Preferred Embodiment of Present Disclosure
3. Example of Implementation by Software <<1. Outline of Present Disclosure>>

The present disclosure is intended to display a zoom image and also output a sound corresponding to the displayed zoom image in a case where there is given an instruction to display a reproduced image as the zoom image.

For example, assume a case where captured image content of a soccer game or the like is reproduced together with a sound. In such a case, when an image is displayed such that the entire soccer game venue is displayed as shown in image P1 in the left part of FIG. 1, the sound is output which is to be heard by a viewer/listener watching the game at a viewpoint location (assumed viewing/listening position) that offers a view like image P1 in the game venue.

More specifically, when image P1 is displayed, there are output sounds to be heard in the entire game venue, such as sound Sd2 "Babble" from spectator seats and sound Sd1 "Whistle" of a referee's whistle heard from the ground at a distance. These sounds are to be heard by a viewer/listener assumed to be at a spectator seat corresponding to the viewpoint location that offers a view like image P1.

Figure 1:
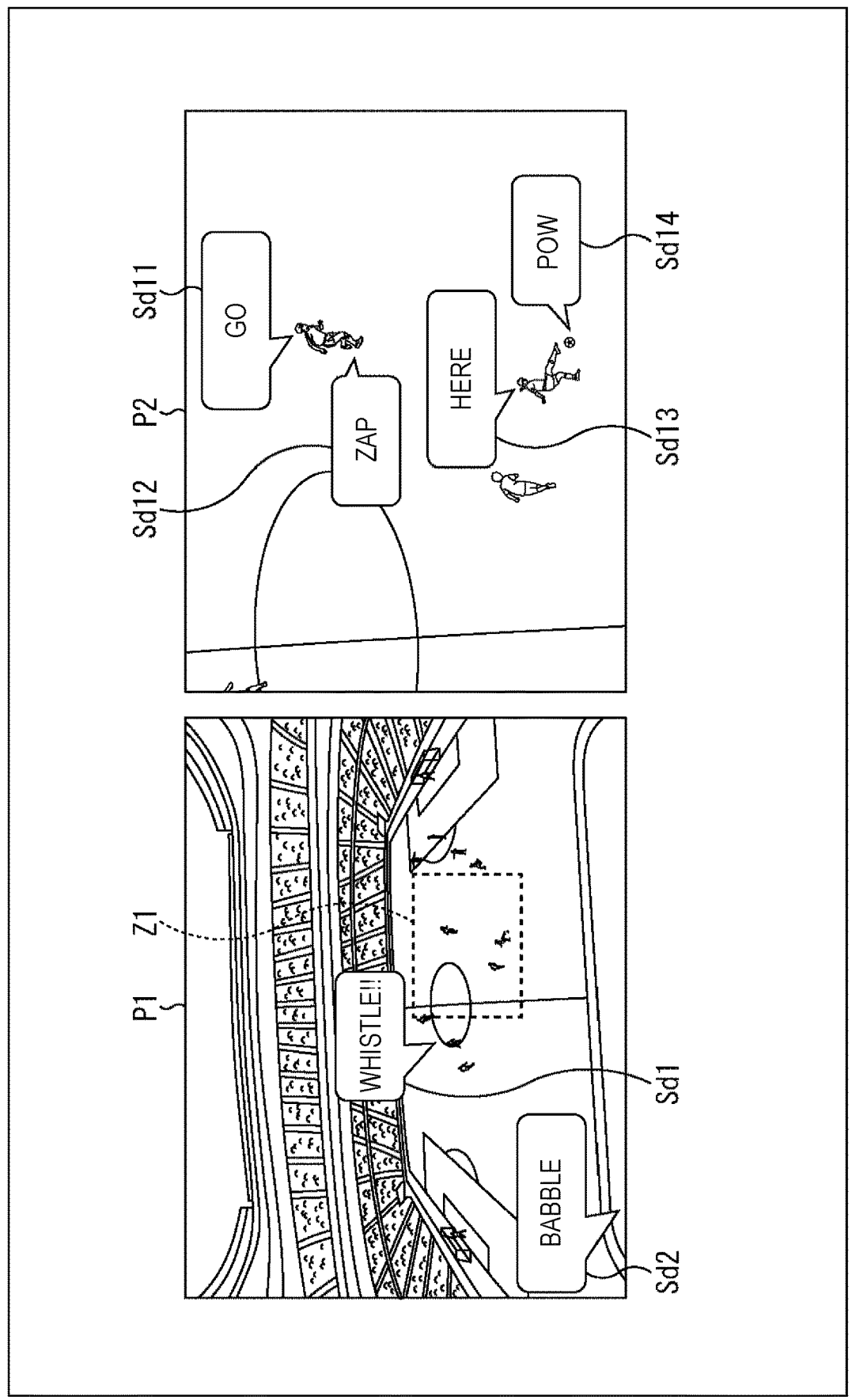
FIG. 1 is a diagram illustrating the outline of the present disclosure.

Meanwhile, in a case where there is given an instruction to display range Z1 enclosed by a dotted line while zooming in on range Z1 in image P1, image P2 is displayed as a zoom image of range Z1 as shown in the right part of FIG. 1.

In a case where image P2 is displayed, there are output sounds such as players' conversation and footsteps of players running on the grass, as heard by the viewer/listener when it is assumed that the viewer/listener has moved to a viewpoint location that offers a view like image P2.

That is, when image P2 as a zoom image of range Z1 of image P1 is displayed, the following sounds are output: sound Sd11 "Go" as a speech uttered by a player being at the upper part of image P2; sound Sd12 "Zap" to be heard when a player is running on the grass; sound Sd13 "Here" as a speech uttered by a player being at the lower part of image P2; and sound Sd14 "Pow" to be heard when a ball is kicked.

As described above, in the present disclosure, when there is given an instruction to reproduce a display image as a zoom image, a zoom image of a specified area is reproduced and displayed. In addition, a sound is reproduced which is to be heard at a viewpoint location where a person views, as a real object, an object in the image reproduced as the zoom image.

This allows a viewer/listener to have a feeling as if he/she viewed the object and heard the sound at the viewpoint location of the image reproduced as the zoom image. Thus, the viewer/listener can enjoy the viewing/listening of image content reproduced as a zoom image with a higher sense of immersion.

<<2. Preferred Embodiment of Present Disclosure>>

Next, a configuration example of an information processing system according to the present disclosure will be described with reference to FIG. 2.

Figure 2:
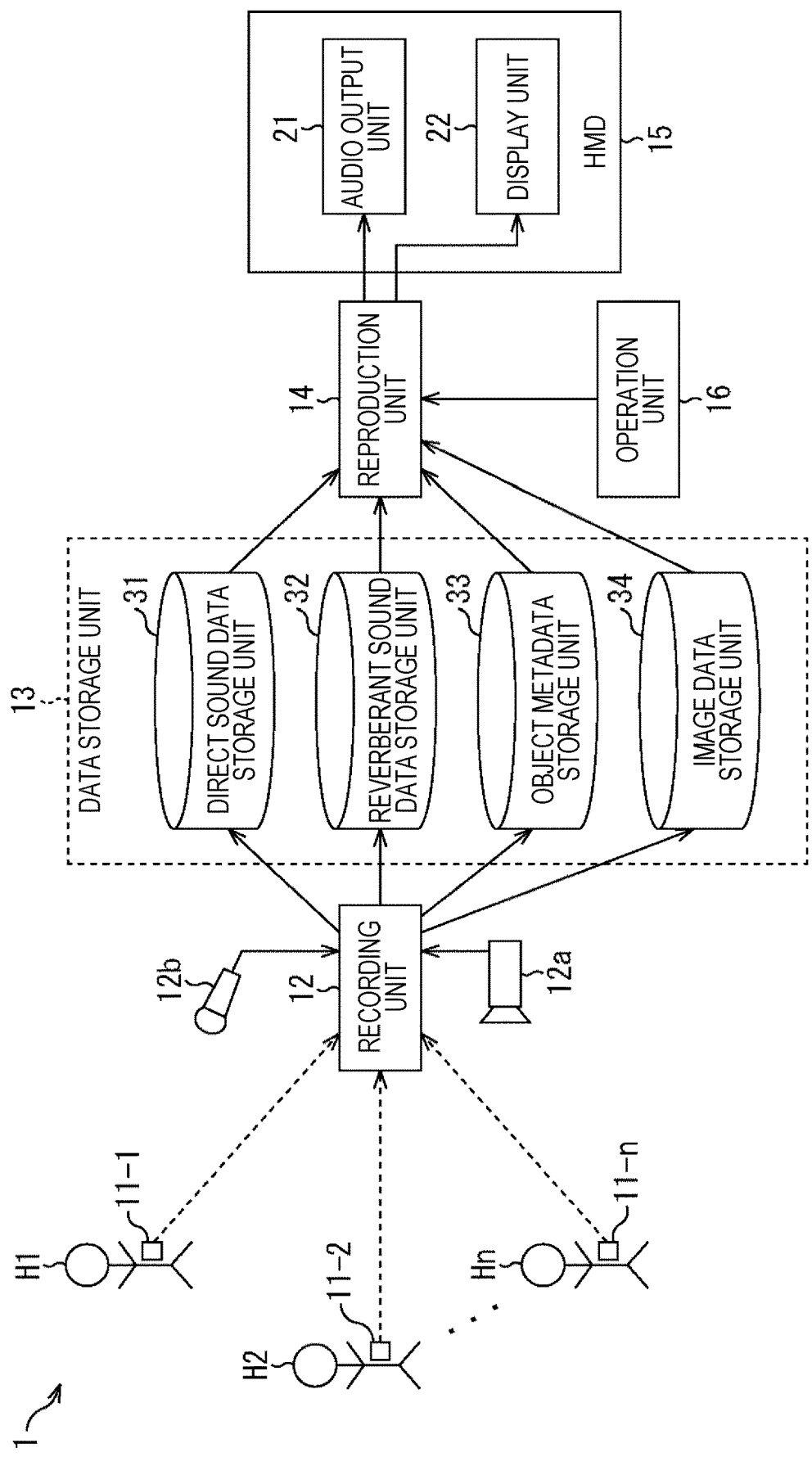
FIG. 2 is a diagram illustrating a configuration example of an information processing system according to the present disclosure.

An information processing system 1 in FIG. 2 records, for example, image content of the broadcast of sports such as soccer and baseball together with sound, and stores the image content and the sound as data. Then, the information processing system 1 reads the stored data, outputs the data to a head mounted display (HMD) mounted on the head of a viewer/listener, and reproduces the image and the sound. At this time, when there is given an instruction to display the image as a zoom image, the zoom image is displayed. In addition, a sound is reproduced which is to be heard at an assumed viewing/listening position (a user's viewing/listening position in a space represented by the zoom image) for the zoom image.

Note that the recorded image content may be something other than the broadcast of sports such as soccer and baseball, and may be, for example, a live concert, a stage play, or the like.

The information processing system 1 includes terminals 11-1 to 11-n, a recording unit 12, a data storage unit 13, a reproduction unit 14, a head mounted display (HMD) 15, and an operation unit 16.

The terminals 11-1 to 11-n are attached to players H1 to Hn of sports such as soccer and baseball to be recorded as image content. The terminals 11-1 to 11-n respectively detect information on sounds around players H1 to Hn, the locations of players H1 to Hn, directions that players H1 to Hn face, and the postures of players H1 to Hn, and transmits the detected information as recorded data to the recording unit 12.

Note that in a case where it is not necessary to particularly distinguish the terminals 11-1 to 11-n, the terminals 11-1 to 11-n are each simply referred to as a terminal 11. The same applies to other constituent elements. Furthermore, a detailed configuration example of the terminal 11 will be described later with reference to FIG. 3. In addition, in the case of image content of a live concert, a stage play, or the like, the terminal 11 is attached to, an artist as a performer of the live concert, an actor of the stage play, or the like. Moreover, players, artists, actors, and the like can be considered objects in the image content. Therefore, hereinafter, players, artists, and actors wearing the terminals 11 are also referred to as objects.

The recording unit 12 includes a camera 12a and a microphone 12b. The camera 12a captures an image of a game or the like. The microphone 12b records a sound around a position where the camera 12a captures the image and a sound of the entire stadium. The recording unit 12 records the image captured by the camera 12a in association with the sounds recorded by the microphone 12b. Here, the sound recorded by the microphone 12b is overall sound linked to the camera 12a. Thus, the sound captured by the microphone 12b is hereinafter referred to as full-dome sound. Furthermore, the recording unit 12 acquires recorded data transmitted from the terminals 11-1 to 11-n. Then, the recording unit 12 stores, in the data storage unit 13, audio data, location information, and direction and posture information included in the recorded data in association with each other.

The data storage unit 13 includes a direct sound data storage unit 31, a reverberant sound data storage unit 32, an object metadata storage unit 33, and an image data storage unit 34.

The recording unit 12 extracts audio data from the recorded data, and separates the extracted audio data into direct sound data and reverberant sound data. Then, the recording unit 12 causes the direct sound data to be stored in the direct sound data storage unit 31, and also causes the reverberant sound data to be stored in the reverberant sound data storage unit 32. Furthermore, the recording unit 12 generates object metadata on the basis of the location information and the direction and posture information, and stores the generated object metadata in the object metadata storage unit 33. Moreover, the recording unit 12 causes full-dome sound data to be stored in the direct sound data storage unit 31. In addition, the recording unit 12 causes image data to be stored in the image data storage unit 34. Note that a detailed configuration example of the recording unit 12 will be described later with reference to FIG. 4.

The reproduction unit 14 reads the direct sound data, reverberant sound data, object metadata, and image data of specified content to be reproduced from the data storage unit 13. Then, the reproduction unit 14 performs predetermined processing on the read data. Thus, the reproduction unit 14 displays the read data as an image on a display unit 22 of the HMD 15, and also causes the read data to be output as audio from an audio output unit 21.

Furthermore, when an instruction to perform zoom reproduction is given (an instruction to perform zoom viewing/listening is given) on the basis of an operation signal output according to details of an operation performed by a user using the operation unit 16, the reproduction unit 14 generates an image to be displayed as a zoom image, and also generates a sound such that the sound enables the user to feel a change in a sense of distance in the zoom image. Then, the reproduction unit 14 outputs each of the image and the sound to the HMD 15, and causes the display unit 22 to display the image as a zoom image and the audio output unit 21 to output the sound to be heard at a viewing/listening position of the zoom image. Note that a detailed configuration example of the reproduction unit 14 will be described later with reference to FIG. 6.

The HMD 15 is mounted on the user's head and includes the audio output unit 21 and the display unit 22. The audio output unit 21 includes a speaker, headphones, and the like. The display unit 22 includes a display such as a liquid crystal display (LCD) or an organic electro luminescence (EL). The HMD 15 obtains the image data and the audio data supplied from the reproduction unit 14. Thus, the HMD 15 causes the display unit 22 to display an image, and also causes the audio output unit 21 to output audio.

More specifically, the HMD 15 includes an acceleration sensor, a gyro sensor, and the like. In response to a change in the direction or position of the user's head with the HMD 15 mounted thereon, the HMD 15 changes a viewpoint location of image content or full-dome content to provide display on the display unit 22. That is, the display unit 22 of the HMD 15 displays an area of the image content corresponding to the viewpoint location determined by the position and direction of the HMD 15. Then, an object displayed in the area of the image content corresponding to the viewpoint location is regarded as an object that requires adjusting the gain of a sound so that the sound corresponds to the viewpoint location.

<Example of Terminal Configuration>

Figure 3:
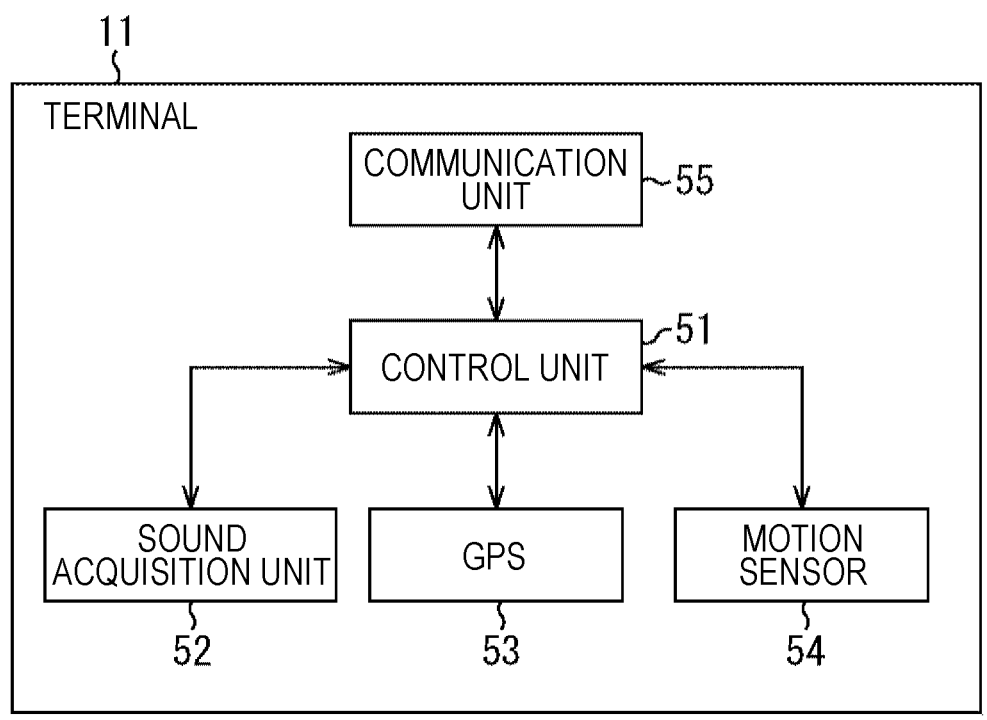
FIG. 3 is a block diagram illustrating a configuration example of a terminal in FIG. 2.

Next, a configuration example of the terminal 11 will be described with reference to a block diagram of FIG. 3.

The terminal 11 is attached to, for example, each sports player appearing in image content to be recorded by the recording unit 12. The terminal 11 includes a control unit 51, a sound acquisition unit 52, a GPS 53, a motion sensor 54, and a communication unit 55.

The control unit 51 controls the entire operation of the terminal 11.

The sound acquisition unit 52 includes a microphone and the like. The sound acquisition unit 52 acquires sounds such as a player's voice, breath sounds, and footsteps, and outputs the acquired audio data to the control unit 51.

The global positioning system (GPS) 53 receives signals from satellites (not shown), obtains location information including latitude and longitude on the earth, and outputs the location information as location information of the player to the control unit 51.

The motion sensor 54 measures an acceleration, and detects a direction that the player faces and the posture of the player on the basis of the result of the measurement. Then, the motion sensor 54 outputs the detected direction and posture as direction and posture information to the control unit 51.

The communication unit 55 communicates with the recording unit 12 via a wireless communication line such as Wifi, and exchanges various types of data and programs.

The control unit 51 controls and causes the communication unit 55 to transmit, to the recording unit 12, the audio data, the location information, and the direction and posture information as recorded data in association with a unique identifier for identifying the terminal 11 and time information indicating recording time.

<Configuration Example of Recording Unit>

Figure 4:
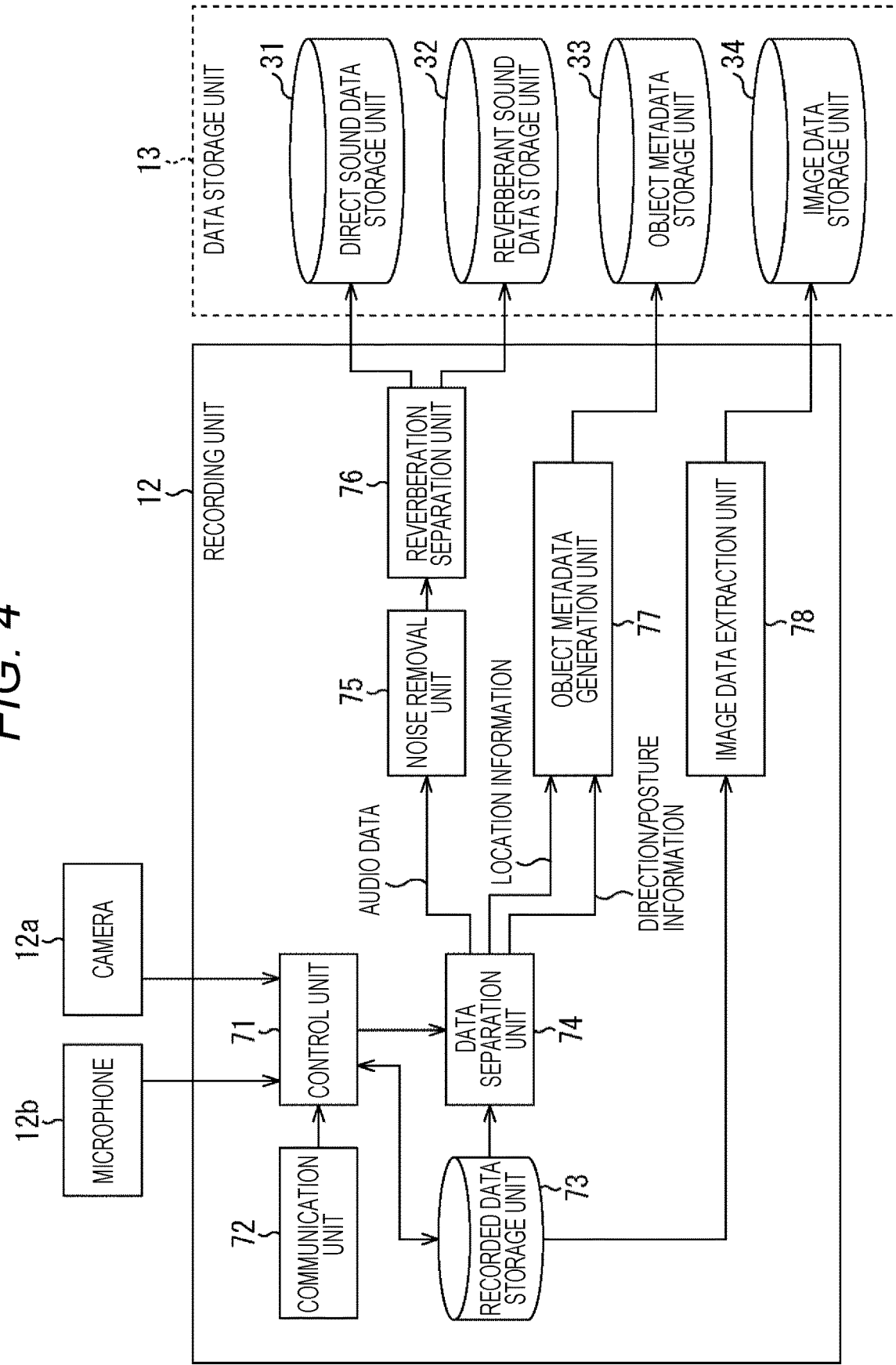
FIG. 4 is a block diagram illustrating a configuration example of a recording unit in FIG. 2.

Next, a configuration example of the recording unit 12 will be described with reference to a block diagram of FIG. 4.

The recording unit 12 includes a control unit 71, a communication unit 72, a recorded data storage unit 73, a data separation unit 74, a noise removal unit 75, a reverberation separation unit 76, an object metadata generation unit 77, and an image data extraction unit 78.

The control unit 71 controls the entire operation of the recording unit 12. The control unit 71 controls the communication unit 72 to receive recorded data transmitted from the terminal 11, and stores the recorded data in the recorded data storage unit 73. Furthermore, the control unit 71 stores, in the recorded data storage unit 73, image data of an image captured by the camera 12*a* and audio data of full-dome sound recorded by the microphone 12*b*.

That is, the recorded data storage unit 73 stores the image data of the image captured by the camera 12*a*, the audio data of the sound recorded by the microphone 12*b*, and the recorded data supplied from the terminal 11 in association with respective identifiers and time information indicating acquisition timing.

The data separation unit 74 reads the recorded data supplied from the terminal 11 and stored in the recorded data storage unit 73, and separates the recorded data into the audio data, the location information, and the direction/posture information. Then, the data separation unit 74 supplies the audio data to the noise removal unit 75, and supplies the location information and the direction and posture information to the object metadata generation unit 77.

The noise removal unit 75 performs, for example, a predetermined noise removal filtering process on the audio data to remove noise, and outputs the processed data to the reverberation separation unit 76.

The reverberation separation unit 76 separates the noise-free audio data into direct sound data and reverberant sound data. Then, the reverberation separation unit 76 stores the direct sound data in the direct sound data storage unit 31, and stores the reverberant sound data in the reverberant sound data storage unit 32. A method for separating audio data into direct sound data and reverberant sound data will be described later with reference to FIG. 5.

The object metadata generation unit 77 generates object metadata for each of objects corresponding to respective players on the basis of the location information and the direction and posture information. Then, the object metadata generation unit 77 stores the generated object metadata in the object metadata storage unit 33. More specifically, the object metadata generation unit 77 generates object metadata for each frame (audio frame) in the audio data. Therefore, the location information and the direction and posture information are stored in audio frame units in the object metadata.

The data separation unit 74 extracts the audio data of the full-dome sound recorded by the microphone 12*b* and stored in the recorded data storage unit 73.

Then, the data separation unit 74 supplies the audio data of the full-dome sound recorded by the microphone 12*b* to the noise removal unit 75 to cause noise time to be removed from the audio data, as with audio data in recorded data for each terminal 11. The noise removal unit 75 supplies the audio data of the full-dome sound, from which noise has been removed, to the reverberation separation unit 76. At this time, the reverberation separation unit 76 causes the audio data of the full-dome sound to be stored as they are in the direct sound data storage unit 31 without separating the audio data into direct sound data and reverberant sound data.

The image data extraction unit 78 extracts the image data stored in the recorded data storage unit 73, and causes the extracted image data to be stored in the image data storage unit 34.

Note that the direct sound data stored in the direct sound data storage unit 31, the reverberant sound data stored in the reverberant sound data storage unit 32, the object metadata stored in the object metadata storage unit 33, and the image data stored in the image data storage unit 34 are each registered in, for example, frame units in association with time information indicating recording timing and an identifier for identifying a terminal.

<Regarding Separation between Direct Sound Data and Reverberant Sound Data>

Here, separation of audio data into direct sound data and reverberant sound data will be described with reference to FIG. 5.

Figure 5:
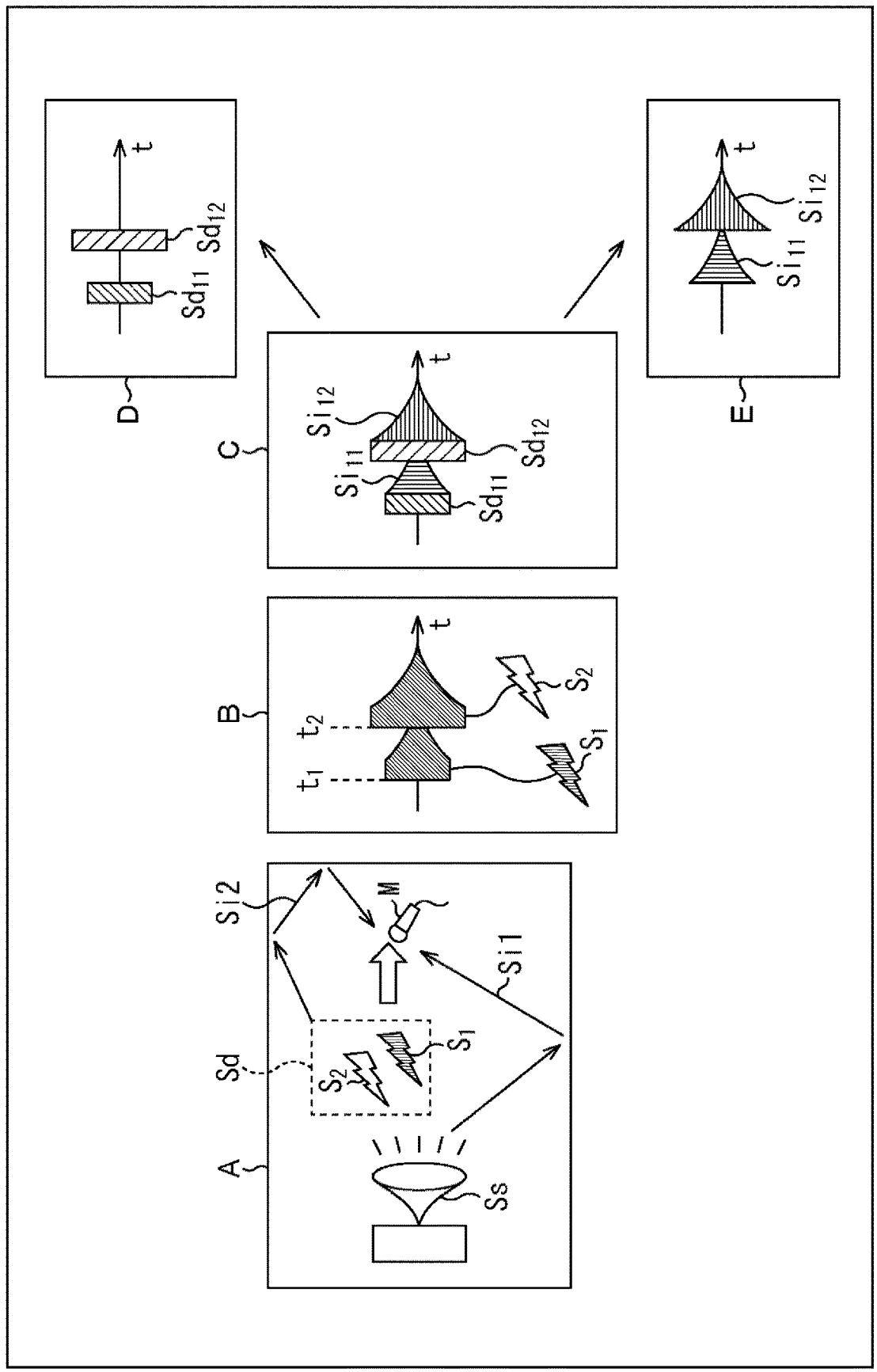
FIG. 5 is a diagram illustrating the principle of separating audio data into direct sound data and reverberant sound data.

As shown in illustration A of FIG. 5, it is assumed that a sound output from speaker Ss is recorded by microphone M in a specific space. At this time, part of sound Sd output from speaker Ss is recorded as direct sound by microphone M. Meanwhile, the other part of the sound is reflected by walls and the like in the space, to be recorded as reverberant sounds Si1 and Si2.

Here, it is assumed that, as sound Sd output from speaker Ss, sound S1 is output at a first time and sound S2 is output at a second time later than the first time.

At this time, the sounds recorded by microphone M have waveforms as shown in, for example, illustration B of FIG. 5.

That is, sound S1 output at the first time is detected at time t1, and sound S2 output at the second time is detected at time t2 later than time t1. The waveform of each sound has a shape such that the peak value is high at the time of reception and the wave attenuates over time.

This is because direct sound reaches microphone M from the front, via a path closest to speaker Ss, to be recorded by microphone M. Thus, direct sound has a high peak value and is detected earlier.

In contrast, reverberant sound arrives from speaker Ss to microphone M via various paths to be recorded by microphone M. Thus, reverberant sound is recorded later than direct sound. In addition, reverberant sound has a waveform such that power decreases and the peak value attenuates as the length of the path increases.

As a result, the waveforms in illustration B of FIG. 5 can be considered waveforms in which waveforms Sd11 and Sd12 of direct sounds and waveforms Si11 and Si12 of reverberant sounds are synthesized, as shown in illustration C of FIG. 5.

Thus, the reverberation separation unit 76 extracts, as direct sound data, audio data including waveforms Sd11 and Sd12 as shown in illustration D of FIG. 5. Furthermore, the reverberation separation unit 76 extracts, as reverberant sound data, audio data including waveforms Si11 and Si12 as shown in illustration E of FIG. 5. That is, the reverberation separation unit 76 separates audio data into direct sound data and reverberant sound data according to the principle shown in FIG. 5.

<Configuration Example of Reproduction Unit>

Next, a configuration example of the reproduction unit 14 will be described with reference to a block diagram of FIG. 6.

The reproduction unit 14 includes a control unit 90, a meta parser unit 91, an object location/posture specification unit 92, a proximity object determination unit 93, an audio decoding unit 94, an object mixing unit 95, a phase adjustment unit 96, a 3D audio renderer 97, a user interface (UI) processing unit 98, a gain adjustment unit 99, an image decoding unit 100, and an image renderer 101.

The control unit 90 controls the entire operation of the reproduction unit 14.

The meta parser unit 91 reads object metadata of an object requiring processing from the object metadata storage unit 33. Then, the meta parser unit 91 supplies location and posture information included in the object metadata to the object location/posture specification unit 92, and also supplies location information to the proximity object determination unit 93. Here, the object requiring processing refers to, for example, an object corresponding to a player shown in a zoom image determined on the basis of information on a specified zoom magnification and zoom position in a case where the operation unit 16 is operated to give an instruction to display the zoom image.

The object location/posture specification unit 92 specifies the locations and postures of objects as players one by one, on the basis of the location and posture information included in the object metadata, and outputs the specified locations and postures to the object mixing unit 95.

The proximity object determination unit 93 determines the presence or absence of the proximity of each object (whether or not objects are located in proximity to each other) on the basis of the location information of the object data, and outputs the result of the determination to the object mixing unit 95. More specifically, the proximity object determination unit 93 sets occupation ranges of players as objects one by one, and determines the presence or absence of proximity by determining whether or not the occupation ranges overlap on the basis of each location information. Note that, in the present embodiment, determination of the presence or absence of proximity, that is, proximity determination will be described as a determination based on whether or not the occupation ranges of the players as objects overlap with each other. However, another method may be used for determination as long as it is possible to determine whether or not the objects are located in proximity to each other. For example, the proximity may be determined on the basis of whether or not the distance between the objects is equal to or less than a predetermined proximity determination distance.

The audio decoding unit 94 reads direct sound data from the direct sound data storage unit 31 and decodes the read direct sound data, for an object requiring processing. In addition, the audio decoding unit 94 reads reverberant sound data from the reverberant sound data storage unit 32 and decodes the read reverberant sound data, for the object requiring processing. Then, the audio decoding unit 94 outputs the direct sound data and the reverberant sound data as decoding results to the object mixing unit 95.

Furthermore, the audio decoding unit 94 reads the audio data of full-dome sound from the direct sound data storage unit 31, decodes the read audio data, and outputs a decoding result to the phase adjustment unit 96. This is because the audio data of full-dome sound are stored in the direct sound data storage unit 31 without being separated into direct sound data and reverberant sound data.

The UI processing unit 98 outputs information on details of a received operation to the control unit 90 on the basis of an operation signal corresponding to operation details supplied from the operation unit 16. The control unit 90 acquires information on a zoom magnification and a zoom position related to a zoom operation according to the details of operation of the operation unit 16 via the UI control unit 98. Then, the control unit 90 supplies the acquired information to the meta parser unit 91, the audio decoding unit 94, the object mixing unit 95, the phase adjustment unit 96, the 3D audio renderer 97, the gain adjustment unit 99, and the image renderer 101.

Note that the operation unit 16 may be operated to perform a zoom operation if the operation unit 16 has a stick-type or button-type configuration. Alternatively, it is also possible to adopt a configuration in which a user's line of sight is detected and the detected user's line of sight is regarded as a zoom operation for displaying, as a zoom image, a predetermined range of an image centered on the position of any point in the image when the user gazes at the point for a predetermined period of time.

The object mixing unit 95 sets basic gain (sound gain) and spread to be applied to the audio data of an object on the basis of a relative distance from the assumed viewing/listening position (user's viewing/listening position in the assumed image space) to the object. The relative distance is obtained from information on the location and posture of the object and the information on a zoom magnification and a zoom position.

Furthermore, the object mixing unit 95 mixes direct sound data and reverberant sound data for each object according to a direction that the object faces in the image content, and outputs the mixed data to the 3D audio renderer 97.

Moreover, in a case where a proximity determination result supplied from the proximity object determination unit 93 indicates that objects are located in proximity to each other, the object mixing unit 95 mixes audio data of a plurality of the objects in proximity to each other to obtain audio data of a single object in accordance with the state of proximity on the basis of the proximity determination result. Then, the object mixing unit 95 outputs the obtained audio data to the 3D audio renderer 97. This is to prevent excess gain. The same sound may be output for objects located in proximity to each other. This may cause excess gain. However, as a result of managing audio data as a single object, it is possible to prevent excess gain from being caused.

The phase adjustment unit 96 adjusts the phase of the full-dome sound supplied from the audio decoding unit 94, and outputs the adjusted sound to the 3D audio renderer 97.

The gain adjustment unit 99 outputs a signal for adjusting gain to the 3D audio renderer 97 according to the information on the zoom magnification from the control unit 90.

The 3D audio renderer 97 renders the audio data for each object supplied from the object mixing unit 95 and the phase-adjusted full-dome sound data supplied from the phase adjustment unit 96. In addition, the 3D audio renderer 97 adjusts gain on the basis of the signal for adjusting gain supplied from the gain adjustment unit 99. Thus, the 3D audio renderer 97 supplies the gain-adjusted data to the audio output unit 21 to cause the gain-adjusted data to be output as audio from the audio output unit 21.

The image decoding unit 100 reads image data from the image data storage unit 34, decodes the image data, and outputs the decoded image data to the image renderer 101.

The image renderer 101 renders an image of the image data on the basis of the information on the zoom magnification and the zoom position supplied from the control unit 90. Then, the image renderer 101 outputs the rendered image to the display unit 22, and causes the display unit 22 to display the rendered image <Method for Mixing Direct Sound and Reverberant Sound by Object Mixing Unit>

Next, an example of mixing direct sound data and reverberant sound data in the object mixing unit 95 will be described with reference to FIG. 7.

Figure 7:
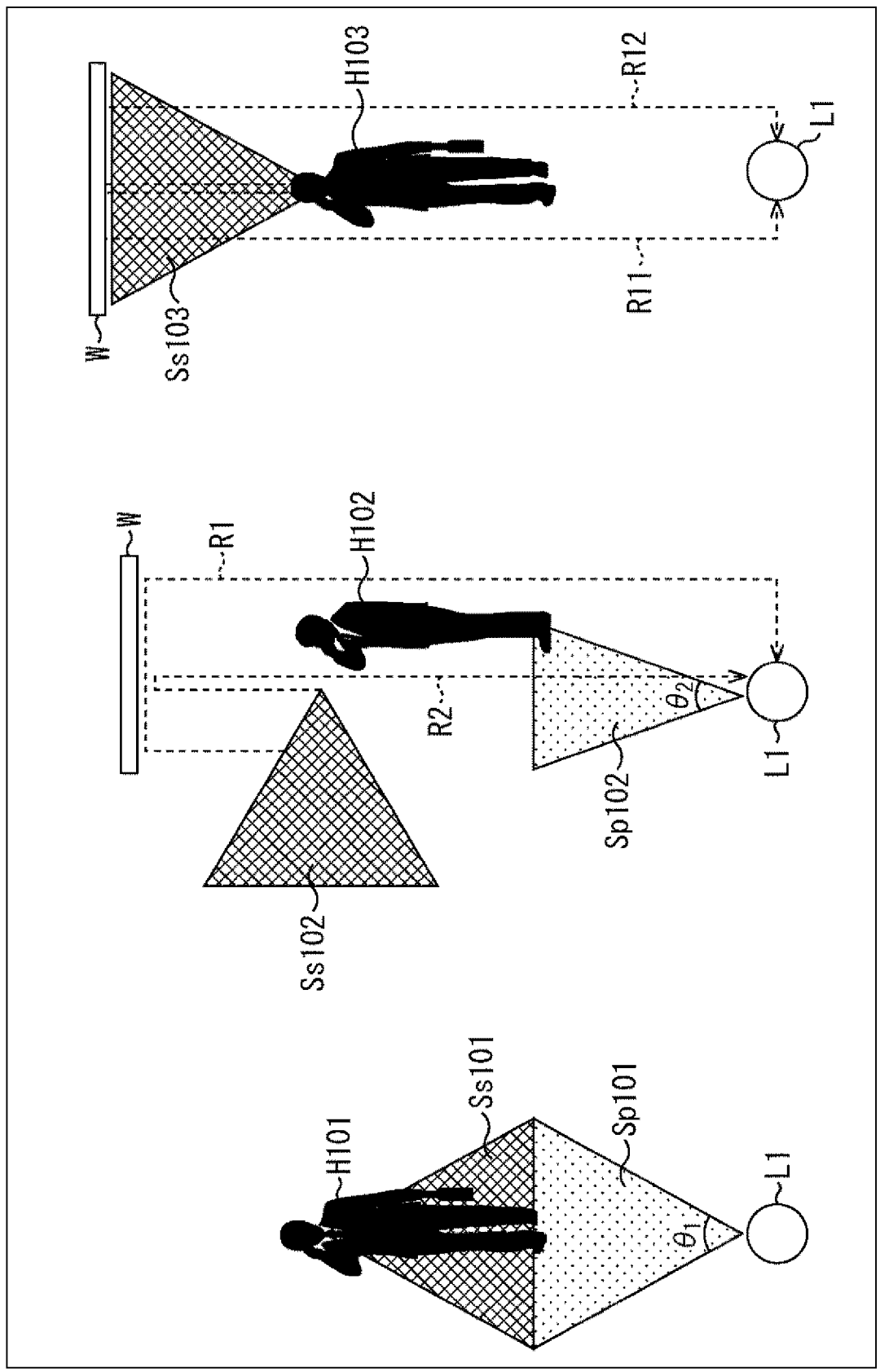
FIG. 7 is a diagram illustrating a method for mixing direct sound and reverberant sound based on the posture of an object.

For example, assume a case where person H101 utters a sound, who corresponds to an object in a posture of facing the front with respect to listening position (a position corresponding to the assumed viewing/listening position of a zoom image) L1 of sound, as shown in the left part of FIG. 7. In such a case, substantially only direct sound is heard, and reverberant sound is hardly heard.

Note that in the left part of FIG. 7, the direct sound uttered by person H101 is represented as direct sound Ss101, and the size of a sound image at listening position L1 is represented by the size of sound image Sp101 in FIG. 7. Furthermore, θ1 in sound image Sp101 represents a spread in FIG. 7. The spread is an index indicating the spread of a sound image, and is represented as an angle in the left-right direction when the listening position is in front. In other words, θ1 stands for the size of a sound image set on the basis of a distance from an assumed position for viewing/listening, and is set such that θ1 has a smaller value in the case of a far sound source and has a larger value in the case of a near sound source. In the case shown in the left part of FIG. 7, spread θ1 is set for sound image Sp101 such that spread θ1 corresponds to the forward spread of direct sound Ss.

For this reason, in the case shown in the left part of FIG. 7, the object mixing unit 95 mixes substantially 100% of direct sound and 0% of reverberant sound to generate audio data of the object.

Furthermore, assume a case where person H102 utters a sound, who corresponds to an object in a posture of facing sideways with respect to listening position L1 of sound, as shown in the central part of FIG. 7. In such a case, a sound to be heard partly includes direct sound, and also includes reverberant sound.

For this reason, in the central part of FIG. 7, the size of sound image Sp102 of direct sound at listening position L1 for direct sound Ss102 uttered by person H102 becomes smaller than that of sound image Sp101 shown in the left part of FIG. 7. Thus, the spread is narrowed down and set to θ2 (<θ1). Furthermore, the case shown in the central part of FIG. 7 is based on the assumption that wall W exists at a position farther than person H102 from listening position L1. Thus, direct sound is reflected by wall W. As a result, reverberant sounds generated on paths R1, R2, and the like are heard at listening position L1.

Therefore, in the case shown in the central part of FIG. 7, the object mixing unit 95 reduces sound image Sp102 of direct sound by narrowing the spread of direct sound from θ1 to θ2 (<θ1) as compared with the case shown in the left part of FIG. 7. In addition, the object mixing unit 95 mixes reverberant sound with direct sound such that the proportion of reverberant sound increases. Thus, audio data of the object are generated.

Moreover, assume a case where person H103 utters a sound, who corresponds to an object in a posture of facing rearward with respect to listening position L1 of sound, as shown in the right part of FIG. 7. In such a case, direct sound is hardly heard, and substantially only reverberant sound is heard.

For this reason, in the right part of FIG. 7, there is substantially no sound image of direct sound at listening position L1 for direct sound Ss103 uttered by person H103. Furthermore, in the right part of FIG. 7, direct sound is reflected by wall W to listening position L1. As a result, reverberant sounds generated on paths R11, R12, and the like are heard at listening position L1.

Therefore, in the case shown in the right part of FIG. 7, the object mixing unit 95 mixes 0% of direct sound and 100% of reverberant sound to generate audio data of the object.

That is, in a case where person H101 faces listening position L1 as shown in the left part of FIG. 7, a sound source is set as a surface sound source of spread θ1. The sound source changes to a sound source of spread θ2 to reduce the sound image in a case where person H102 faces sideways with respect to listening position L1 as shown in the central part of FIG. 7. Ultimately, the area of the surface sound source becomes 0 (spread becomes 0) in a case where person H103 faces rearward with respect to listening position L1 as shown in the right part of FIG. 7.

<Specific Mixing Example of Direct Sound and Reverberant Sound by Object Mixing Unit>

Next, a specific example of mixing direct sound and reverberant sound by the object mixing unit 95 will be described with reference to FIG. 8.

Figure 8:
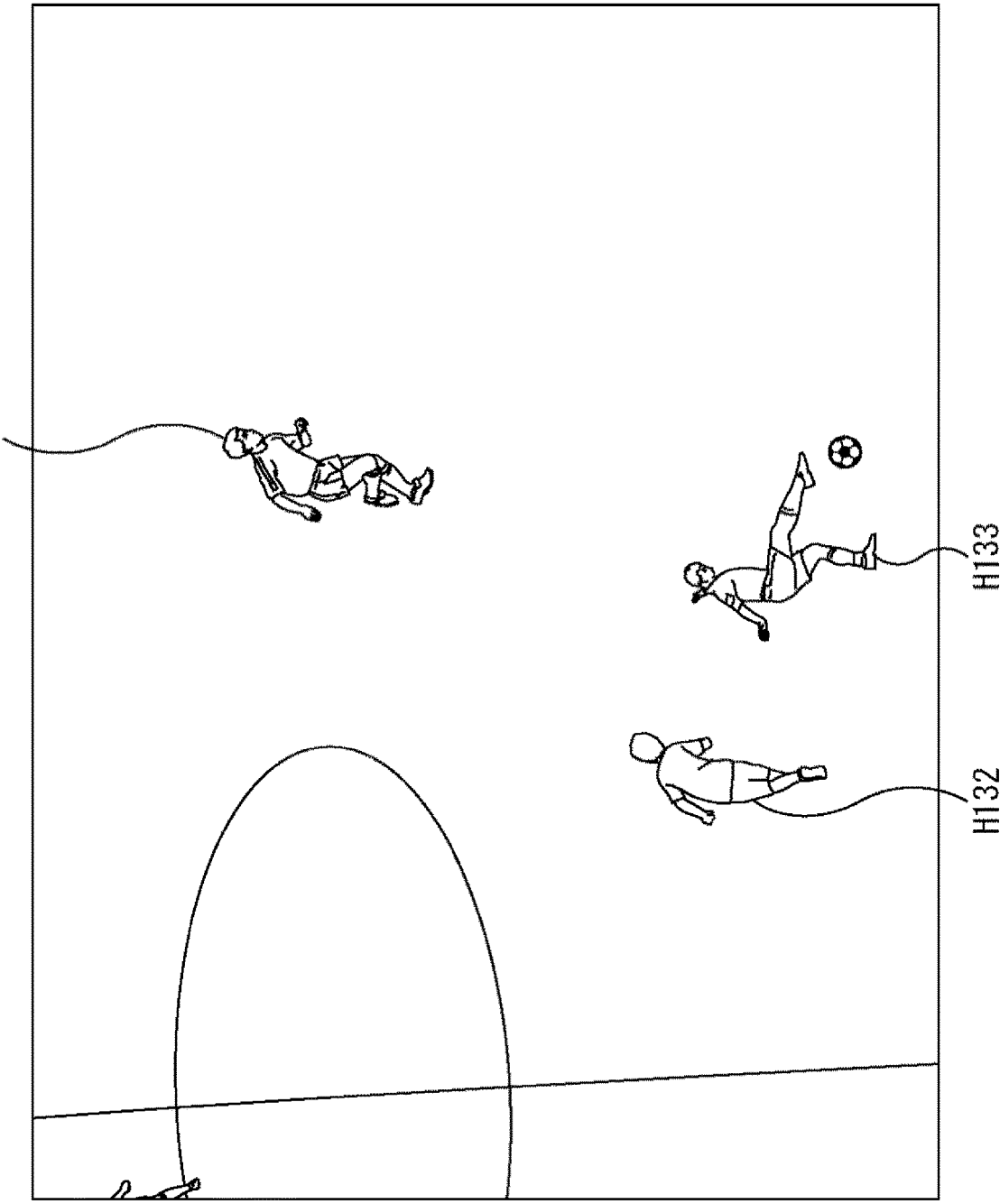
FIG. 8 is a diagram illustrating an example of mixing direct sound and reverberant sound based on the posture of an object.

For example, in a case where player H131 is an object in image content of a soccer game as shown in FIG. 8, player H131 faces diagonally forward with respect to the assumed viewing/listening position (there is shown player H131 facing diagonally with respect to a viewer/listener viewing the display unit 22). Thus, the object mixing unit 95 narrows the spread, and mixes 75% of direct sound and 25% of reverberant sound to generate audio data of the object.

Furthermore, in a case where player H132 is an object in FIG. 8, player H132 faces rearward with respect to the assumed viewing/listening position (there is shown player H132 facing in a direction opposite to the viewer/listener viewing the display unit 22). Thus, no direct sound is heard. Accordingly, the object mixing unit 95 configure settings to narrow the spread, and mixes 0% of direct sound and 100% of reverberant sound to generate audio data of the object.

Moreover, in a case where player H133 is an object in FIG. 8, player H133 faces sideways with respect to the assumed viewing/listening position (there is shown player H133 facing sideways with respect to the viewer/listener viewing the display unit 22). Thus, the object mixing unit 95 configure settings to narrow the spread, and mixes 50% of direct sound and 50% of reverberant sound to generate audio data of the object.

In this way, direct sound and reverberant sound are mixed according to the assumed viewing/listening position, a direction that a player as an object faces, and the player's posture.

<Method for Mixing Direct Sound and Reverberant Sound According to Proximity Determination>

Next, a method for mixing direct sound and reverberant sound according to proximity determination will be described with reference to FIG. 9.

Figure 9:
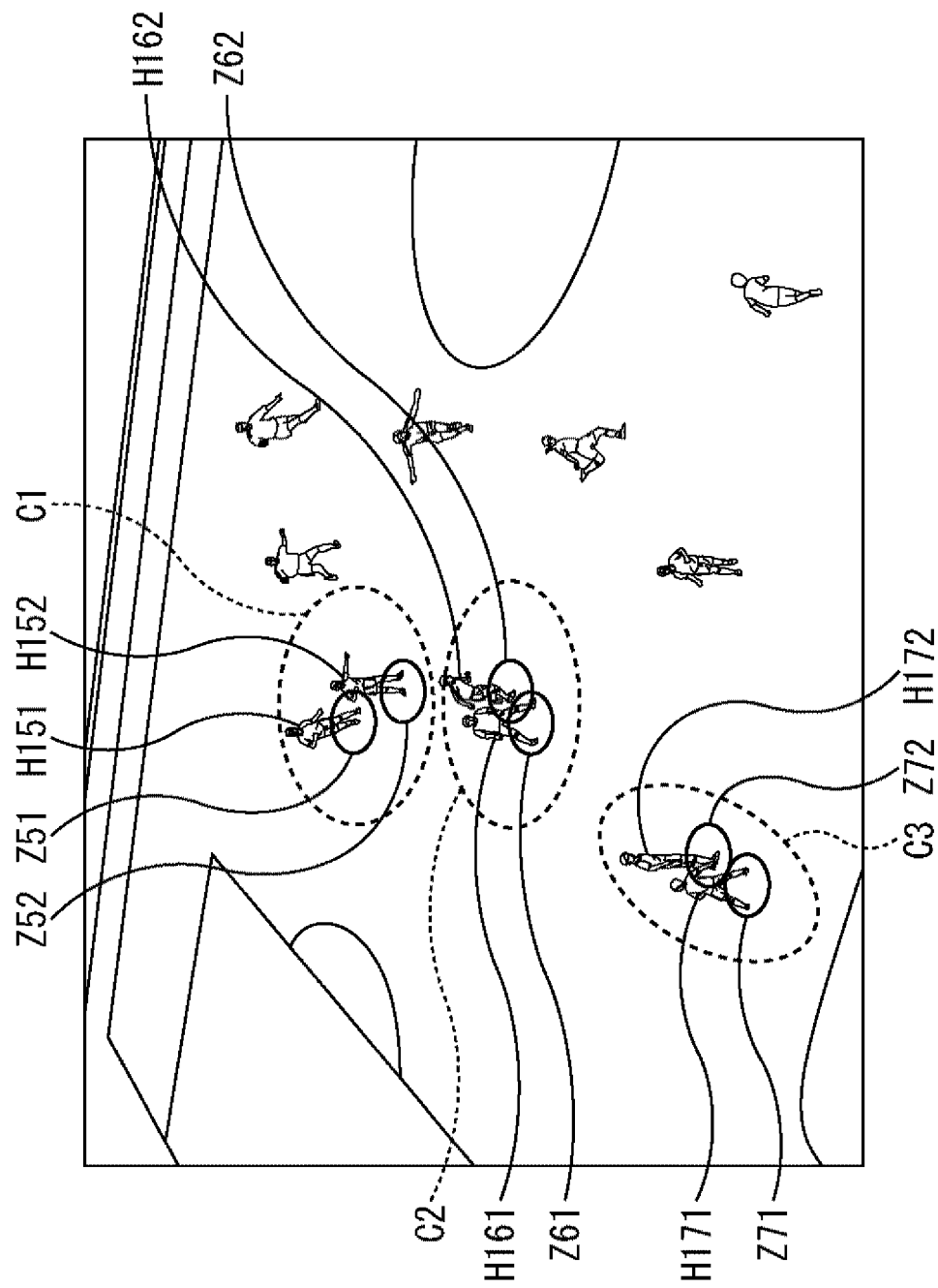
FIG. 9 is a diagram illustrating an example of mixing direct sound and reverberant sound based on determination of object proximity.

The case of image content of a soccer game as shown in FIG. 9 is taken as an example. With regard to, for example, players H151 and H152 existing within a predetermined distance enclosed by dotted line C1, their respective occupation ranges Z51 and Z52 do not overlap. Therefore, the proximity object determination unit 93 determines that players H151 and H152 are not in proximity to each other. Therefore, in this case, the object mixing unit 95 generates audio data of players H151 and H152 separately for respective objects.

Note that although respective occupation ranges Z51 and Z52 of players H151 and H152 are defined as circular ranges having a predetermined radius in FIG. 9, it is also possible to set ranges with other sizes and shapes.

Furthermore, with regard to, for example, players H161 and H162 existing within a predetermined distance enclosed by dotted line C2 in FIG. 9, their respective occupation ranges Z61 and Z62 overlap. Therefore, the proximity object determination unit 93 determines that players H161 and H162 are in proximity to each other. Accordingly, in this case, the object mixing unit 95 regards these objects as a single object and mixes respective audio data on the basis of respective location and posture information of players H161 and H162.

More specifically, for example, for player H161 facing the front (player H161 shown facing a viewer/listener viewing the display unit 22), the object mixing unit 95 mixes 100% of direct sound and 0% of reverberant sound (=direct sound data×1+reverberant sound data×0). In addition, for player H162 facing diagonally forward, the object mixing unit 95 mixes 75% of direct sound and 25% of reverberant sound (=direct sound data×0.75+reverberant sound data×0.25). Moreover, for two players, that is, players H161 and H162, the object mixing unit 95 mixes the respective audio data at 50% each (=(direct sound data×1+reverberant sound data× 0)/2+(direct sound data×0.75+reverberant sound data×0.25)/ 2).

As a result, the respective audio data of players H161 and H162 are mixed as audio data of a single object.

Moreover, for example, with regard to players H171 and H172 existing within a predetermined distance enclosed by dotted line C3 in FIG. 9, their respective occupation ranges Z71 and Z72 overlap. Therefore, the proximity object determination unit 93 determines that the players H171 and H172 are in proximity to each other. Therefore, in this case, the object mixing unit 95 regards these objects as a single object and mixes respective audio data on the basis of the relationship between the locations and postures of players H171 and H172.

More specifically, with regard to, for example, audio data of player H171 facing rearward (player H171 shown facing in a direction opposite to the viewer/listener viewing the display unit 22), the object mixing unit 95 mixes 0% of direct sound and 100% of reverberant sound (=direct sound data×0+reverberant sound data×1). In addition, for player H172 facing sideways, the object mixing unit 95 mixes 50% of direct sound and 50% of reverberant sound (=direct sound data×0.5+reverberant sound data×0.5). Moreover, for two players, that is, players H171 and H172, the object mixing unit 95 mixes the respective audio data at 50% each (=(direct sound data×1+reverberant sound data×0)/2+(direct sound data×0.5+reverberant sound data×0.5)/2).

As a result, the respective audio data of players H171 and H172 are mixed as audio data of a single object. Furthermore, no excess gain or the like is caused. It is thus possible to reduce noise generation.

Note that described above is a case where two players are in proximity to each other. Thus, values divided by 2 are finally added to obtain an average. Meanwhile, in the case of three players or more, the sum of values divided by the number of people corresponding to audio data is calculated, and the calculated sum is treated as an average value.

<Relationship Between Gain and Zoom Magnification of Display Image for Each of Full-Dome Sound and Object Sound>

Next, the relationship between gain and zoom magnification of a display image for each of full-dome sound and object sound will be described with reference to FIG. 10.

Figure 10:
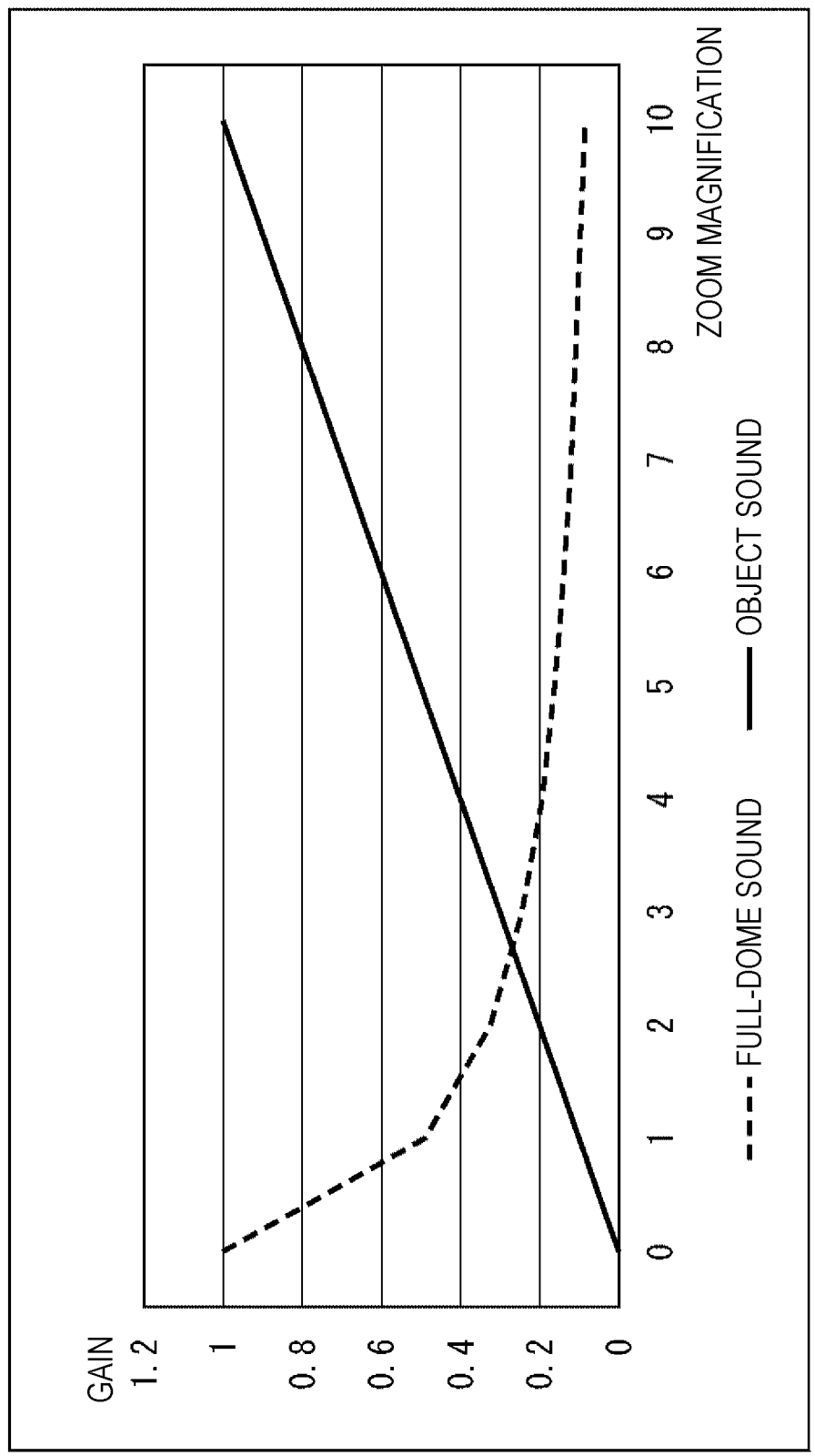
FIG. 10 is a diagram illustrating the relationship between zoom magnification and gain for each of full-dome sound and object sound.

The relationship between gain and zoom magnification of a display image for each of full-dome sound and object sound is as shown in FIG. 10. Note that gain is on the vertical axis, and zoom magnification is on the horizontal axis in FIG. 10.

That is, the gain of full-dome sound decreases as zoom magnification increases. In contrast, object sound increases as zoom magnification increases.

Zoom magnification is increased as a result of being controlled in this manner. For example, in the case of an image displayed such that a specific person as an object is in close-up, ambient sound as full-dome sound can hardly be heard, and instead, conversation, footsteps, and the like of the person corresponding to the object in close-up can be heard well.

Note that although the gain adjustment unit 99 adjusts the gain of full-dome sound data, the phase adjustment unit 96 also reduces the gain by inverting the phase thereof.

<Recording Process>

Figure 11:
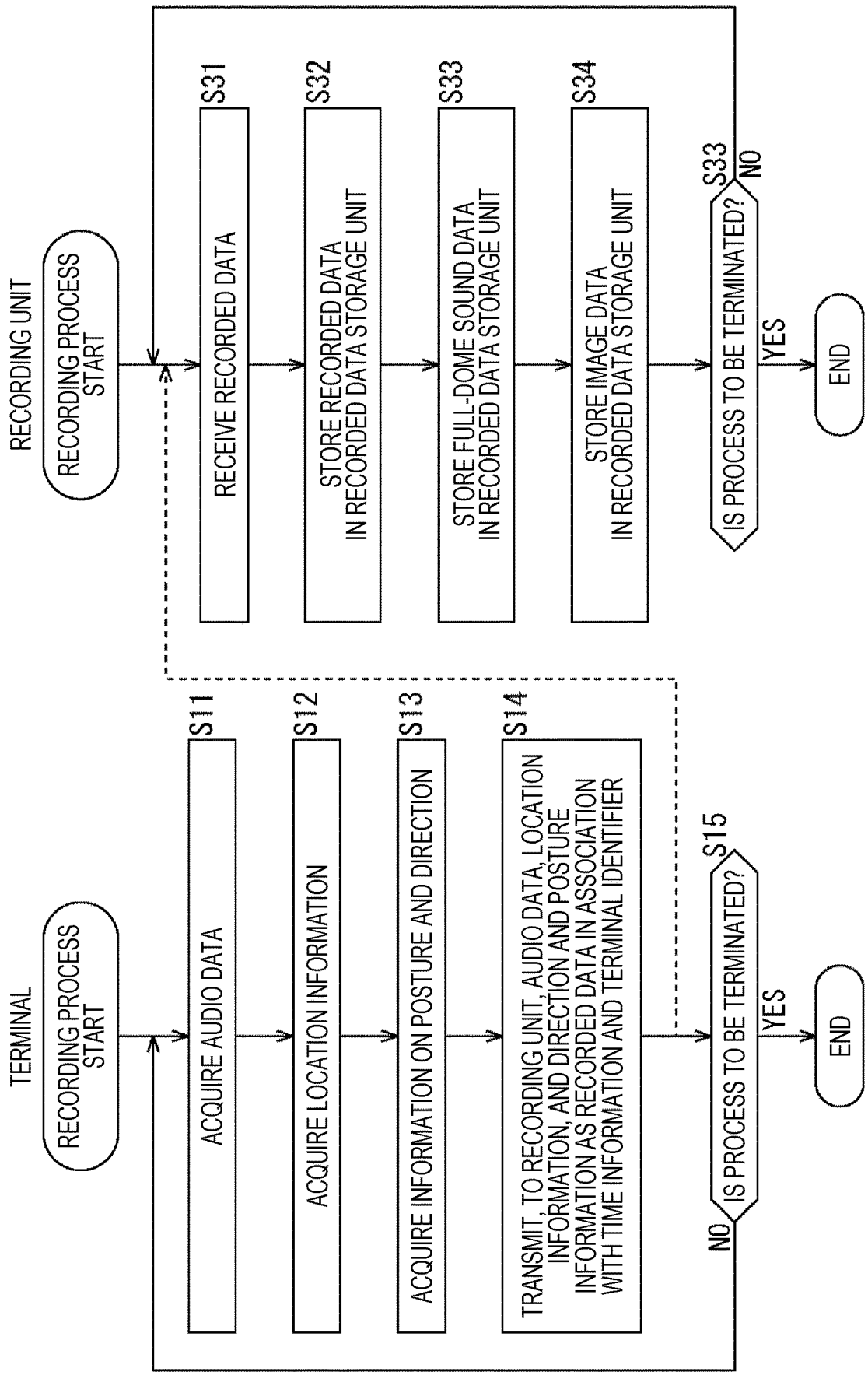
FIG. 11 is a flowchart describing a recording process.

Next, a recording process will be described with reference to a flowchart in FIG. 11.

In step S11, the sound acquisition unit 52 of the terminal 11 acquires sound around a player wearing the terminal 11, and outputs the sound as audio data to the control unit 51.

In step S12, the GPS 52 receives signals from satellites (not shown), obtains location information including latitude and longitude on the earth on the basis of the received signals, and outputs the obtained location information as location information of the player wearing the terminal 11 to the control unit 51.

In step S13, the motion sensor 54 measures an acceleration, detects a direction that the player wearing the terminal 11 faces and the player's posture, and outputs the detected direction and posture to the control unit 51.

In step S14, the control unit 51 controls the communication unit 55 to transmit, to the recording unit 12, the audio data, the location information, and direction and posture information as recorded data in association with time information indicating acquisition time and an identifier for identifying the terminal.

In step S31, the control unit 71 of the recording unit 12 controls the communication unit 72 to receive the recorded data transmitted from the terminal 11.

In step S32, the control unit 71 stores the recorded data, which have been received, in the recorded data storage unit 73.

In step S33, the control unit 71 acquires image data of an image captured by the camera 12a, and stores the acquired image data in the recorded data storage unit 73.

In step S34, the control unit 71 acquires audio data of full-dome sound recorded by the microphone 12b, and stores the acquired audio data in the recorded data storage unit 73.

In steps S15 and S35, it is determined whether or not instructions to terminate the processes have been given. In a case where no instructions to terminate the processes have been given, the processes return to steps S11 and S31. That is, until there are given instructions to terminate the processes, the processing of steps S11 to S15 is repeated in the terminal 11, and the processing of steps S31 to S35 is repeated in the recording unit 12.

Then, when there are given instructions to terminate the processes, the respective processes are terminated in steps S15 and S35.

With the above process, the recording unit 12 sequentially stores, in the recorded data storage unit 73, the recorded data transmitted from the terminal 11. Furthermore, the recording unit 12 also stores, in the recorded data storage unit 73, the image captured by the camera 12a and the audio data of the full-dome sound recorded by the microphone 12b.

Note that the recorded data from the terminal 11, the image data, and the audio data of the full-dome sound are each stored in association with an identifier that enables the terminal 11 to be identified and time information indicating time when the information or data has been acquired.

<Data Storage Process>

Next, a data storage process will be described with reference to a flowchart in FIG. 12. The data storage process is a process to be performed in a state where recorded data supplied from each terminal 11 in the recording process described above are stored in the recorded data storage unit 73.

In step S51, the data separation unit 74 sets, as recorded data to be processed, recorded data yet to be processed among the recorded data stored in the recorded data storage unit 73.

In step S52, the data separation unit 74 separates the recorded data to be processed into audio data, location information, and direction and posture information. Then, the data separation unit 74 outputs the audio data to the noise removal unit 75, and also outputs the location information and the direction and posture information to the object metadata generation unit 77.

In step S53, the noise removal unit 75 removes noise from the audio data, and outputs resulting audio data to the reverberation separation unit 76.

In step S54, the reverberation separation unit 76 separates the audio data into direct sound data and reverberant sound data, stores the direct sound data in the direct sound data storage unit 31, and also stores the reverberant sound data in the reverberant sound data storage unit 32.

In step S55, the object metadata generation unit 77 generates object metadata on the basis of the location information and the direction and posture information, and stores the generated object metadata in the object metadata storage unit 33. Here, the object metadata are stored in a time series in units of audio frames.

In step S56, the data separation unit 74 determines whether or not there are recorded data yet to be processed. In a case where there are recorded data yet to be processed, the process returns to step S51. That is, the processing of steps S51 to S56 is repeated until the processing is performed on all the recorded data. Then, in a case where it is determined in step S56 that there are no recorded data yet to be processed, the process proceeds to step S57.

In step S57, the data separation unit 74 extracts the audio data of full-dome sound stored in the recorded data storage unit 73, and supplies the audio data to the noise removal unit 75. The noise removal unit 75 removes noise from the audio data of full-dome sound, and supplies resulting audio data to the reverberation separation unit 76.

In step S58, the reverberation separation unit 76 does not separate reverberant sound from the audio data of full-dome sound, and stores the whole audio data as direct sound data in the direct sound data storage unit 31. In other words, no process is performed separately for direct sound and reverberant sound of full-dome sound. Therefore, direct sound and reverberant sound are not separated, and the whole full-dome sound is stored as direct sound data in the direct sound data storage unit 31. However, if necessary, the audio data of full-dome sound may be managed after being separated into direct sound and reverberant sound.

In step S59, the image data extraction unit 78 extracts the image data stored in the recorded data storage unit 73, and stores the extracted image data in the image data storage unit 34.

With the above process, the recorded data storage unit 73 sequentially reads recorded data stored for each terminal 11, that is, for each object, and separates the recorded data into audio data, location information, and direction and posture information. Then, after noise is removed from the audio data, the audio data are separated into direct sound data and reverberant sound data. Then, the direct sound data and the reverberant sound data are stored in the direct sound data storage unit 31 and the reverberant sound data storage unit 32, respectively. Furthermore, object metadata are generated on the basis of the location information and the direction and posture information, and stored in the object metadata storage unit 33. Moreover, the audio data of full-dome sound stored in the recorded data storage unit 73 are extracted, and noise is removed therefrom. However, reverberant sound is not separated from the audio data, and the audio data are stored as they are in the direct sound data storage unit 31. Furthermore, image data stored in the recorded data storage unit 73 are extracted and stored in the image data storage unit 34.

<Reproduction Process>

Next, a reproduction process will be described with reference to a flowchart in FIG. 13. Note that the reproduction process is based on the premise that the above-described data storage process has been performed and various types of data have been separated and stored in the data storage unit 13.

In step S71, the control unit 90 determines whether or not a zoom operation has been performed, on the basis of whether or not there has been supplied, via the UI processing unit 98, an operation signal indicating that the operation unit 16 has been operated to perform the zoom operation. In a case where it is determined in step S71 that a zoom operation has not been performed, the process proceeds to step S88.

In step S88, the control unit 90 instructs the audio decoding unit 94 to perform normal reproduction. As a result, the audio decoding unit 94 reads and decodes the audio data of full-dome sound stored in the direct sound data storage unit 31, and outputs the decoded audio data to the phase adjustment unit 96. The phase adjustment unit 96 supplies the 3D audio renderer 97 with the decoded audio data of full-dome sound as they are, that is, without adjusting the phase of the full-dome sound to attenuate the full-dome sound. The 3D audio renderer 97 outputs the decoded audio data of full-dome sound to the audio output unit 21, and causes the audio data to be output as audio from the audio output unit 21. Furthermore, the gain adjustment unit 99 sets the gain of the audio data of full-dome sound to a maximum value. This is because, in this case, normal reproduction is performed in which no zoom operation is performed.

In step S89, the image decoding unit 100 reads image data from the image data storage unit 34, decodes the image data, and outputs the decoded image data to the image renderer 101. The image renderer 101 renders an image of the decoded image data in such a way as to display the entire image without zooming in on the image. Then, the image renderer 101 outputs the rendered image to the display unit 22, and causes the display unit 22 to display the rendered image.

The process proceeds to step S87, and it is determined whether or not an instruction to terminate the process has been given. In a case where no instruction to terminate the process has been given, the process returns to step S71.

That is, in the case of normal reproduction in which no zoom operation is performed, the processing of steps S71, S88, S89, and S87 is repeated. As a result, the image captured by the camera 12a in the recording process is displayed as it is on the display unit 22. In addition, the full-dome sound is continuously output from the audio output unit 21.

Meanwhile, in a case where the operation unit 16 is operated to perform a zoom operation in step S71, the process proceeds to step S72.

In step S72, the control unit 90 supplies information on a zoom magnification and a zoom position corresponding to the zoom operation performed with the operation unit 16, to the image renderer 101, the meta parser unit 91, the object mixing unit 95, the phase adjustment unit 96, and the gain adjustment unit 99.

In step S73, the image renderer 101 renders the decoded image data supplied from the image decoding unit 100 on the basis of the information on the zoom magnification and the zoom position, and generates a zoom image. Then, the image renderer 101 outputs the generated zoom image to the display unit 22, and causes the display unit 22 to display the generated zoom image. With this process, a zoom image is generated from an image captured by the camera 12a at the time of recording, and is displayed by the display unit 22. The zoom image is generated at a zoom magnification and a zoom position corresponding to a zoom operation performed with the operation unit 16.

In step S74, the audio decoding unit 94 specifies an object to appear in the zoom image, that is, a player to be shown in the zoom image, on the basis of the information on the zoom magnification and the zoom position corresponding to the zoom operation. Then, the audio decoding unit 94 reads direct sound data and reverberant sound data of the specified object from the direct sound data storage unit 31 and the reverberant sound data storage unit 32, respectively, decodes the direct sound data and the reverberant sound data, and outputs the decoded data to the object mixing unit 95.

In step S75, the meta parser unit 91 specifies the object to appear in the zoom image, that is, the player to be shown in the zoom image, on the basis of the information on the zoom magnification and the zoom position corresponding to the zoom operation. Then, the meta parser unit 91 reads object metadata of the specified object from the object metadata storage unit 33, and outputs the read object metadata to the object location/posture specification unit 92 and the proximity object determination unit 93.

In step S76, the phase adjustment unit 96 inverts the phase of a forward sound to be reproduced in the full-dome sound to substantially attenuate gain.

In step S77, the gain adjustment unit 99 attenuates the gain of the full-dome sound to be reproduced.

That is, with the processing of steps S76 and S77, the gain of the full-dome sound is reduced according to the zoom magnification, as described with reference to FIG. 10.

In step S78, the object mixing unit 95 sets an unprocessed object among objects existing in a zoom area, as a processing target object.

In step S79, the object location/posture specification unit 92 specifies location information and posture information on the basis of the location information and the direction and posture information of the processing target object, and outputs the specified information to the object mixing unit 95.

In step S80, the object mixing unit 95 specifies an assumed viewing/listening position on the basis of the location information of the processing target object, and sets a basic spread and gain to be applied to direct audio data on the basis of a distance from the assumed viewing/listening position to the processing target object. That is, here, the basic spread and gain for the object sound are set on the basis of the relative distance to the assumed viewing/listening position and the zoom magnification by the method described with reference to FIG. 10.

In step S81, the object mixing unit 95 determines whether or not the processing target object is facing the assumed viewing/listening position, on the basis of the posture information of the processing target object. In a case where it is determined in step S81 that the processing target object is not facing the assumed viewing/listening position, the process proceeds to step S82.

In step S82, the object mixing unit 95 performs a direction/posture adjustment process to adjust the spread and the gain according to the direction of the processing target object with respect to the assumed viewing/listening position.

<Direction/Posture Adjustment Process>

Figure 14:
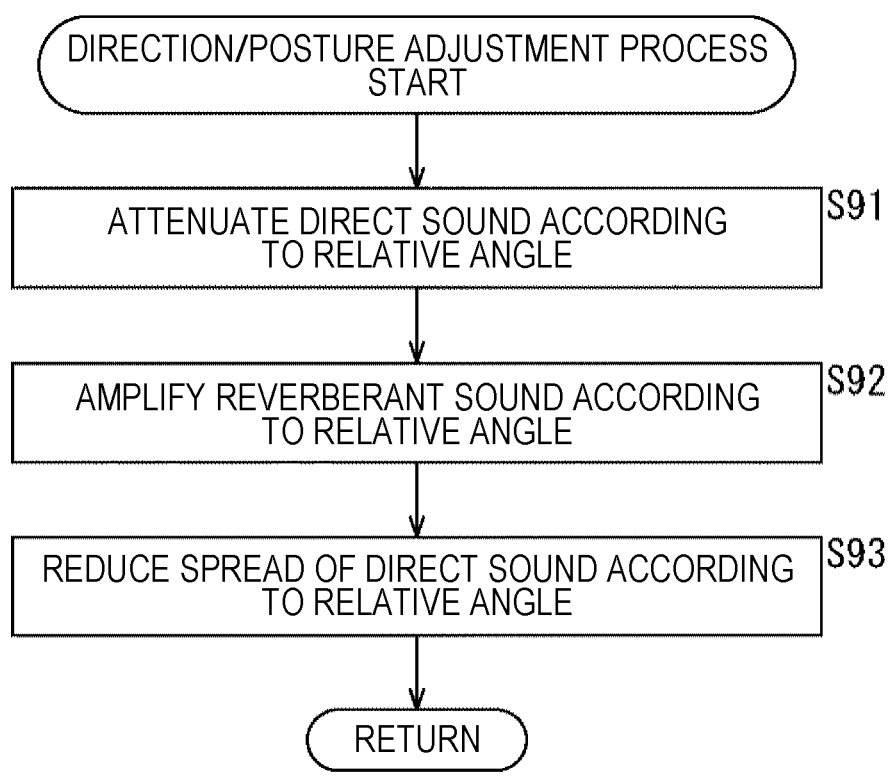
FIG. 14 is a flowchart describing a direction/posture adjustment process.

Here, the direction/posture adjustment process will be described with reference to a flowchart in FIG. 14.

In step S91, the object mixing unit 95 adjusts direct sound data in such a way as to attenuate direct sound, according to the direction of the processing target object with respect to the assumed viewing/listening position.

In step S92, the object mixing unit 95 adjusts reverberant sound data in such a way as to amplify reverberant sound, according to the direction of the processing target object with respect to the assumed viewing/listening position.

In step S93, the object mixing unit 95 adjusts the direct sound data in such a way as to reduce the spread of the direct sound, according to the direction of the processing target object with respect to the assumed viewing/listening position.

That is, the processing target object is not facing the assumed viewing/listening position. Thus, for example, a sound generated as a result of mixing direct sound and reverberant sound and the rendering thereof is adjusted such that the sound is appropriate in terms of the relationship between a direction that the processing target object faces and the assumed viewing/listening position. The direct sound and the reverberant sound are mixed such that the direct sound attenuates as the spread of the direct sound is narrowed and the reverberant sound is amplified, as described with reference to FIGS. 7 and 8.

Figure 12:
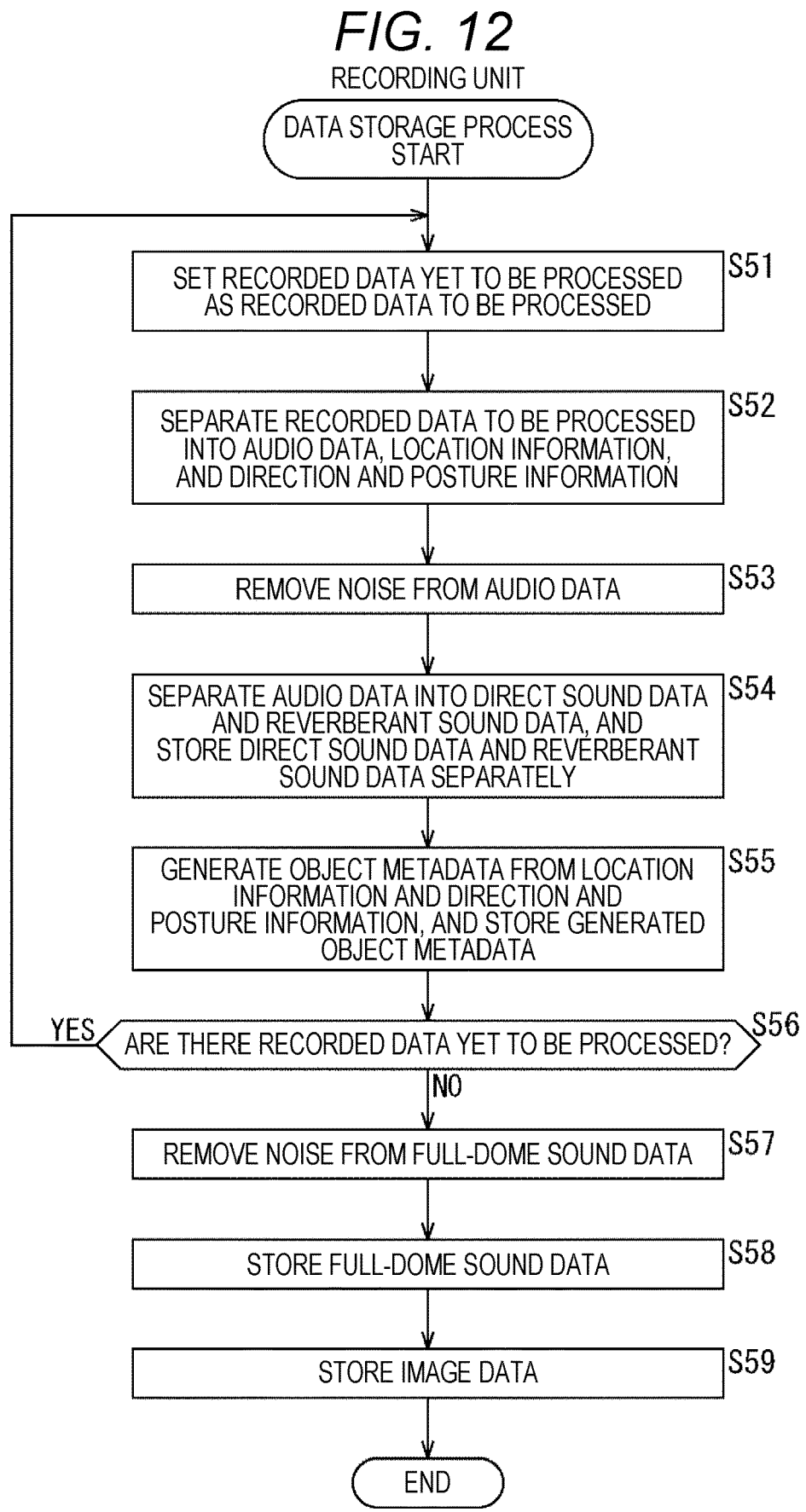
FIG. 12 is a flowchart describing a data storage process.

Here, the description returns to the flowchart of FIG. 12.

Meanwhile, in a case where it is determined in step S81 that the processing target object is facing the assumed viewing/listening position, the processing of step S82 is skipped. That is, in this case, the processing target object is facing the assumed viewing/listening position. Thus, only the direct sound needs to be heard, so that it is not necessary to perform the direction/posture adjustment process for mixing the direct sound with the reverberant sound.

In step S83, the object mixing unit 95 determines whether or not there is an unprocessed object. In a case where there is an unprocessed object, the process returns to step S78. That is, the processing of steps S78 to S83 is repeated until the basic spread and gain corresponding to all the objects are adjusted and direct sound is mixed with reverberant sound for an object not facing the assumed viewing/listening position by the direction/posture adjustment process, as appropriate. Then, in a case where it is determined in step S83 that direct sound and reverberant sound have been adjusted for all the objects and there is no unprocessed object, the process proceeds to step S84.

In step S84, the proximity object determination unit 93 performs a proximity adjustment process, and determines whether or not the occupation ranges of objects existing within a predetermined distance are in proximity to each other. In a case where there are occupation ranges in proximity to each other, the objects in proximity are regarded as a single object and the direct sound data and the reverberant sound data thereof are mixed as data for the single object.

<Proximity Adjustment Process>

Figure 15:
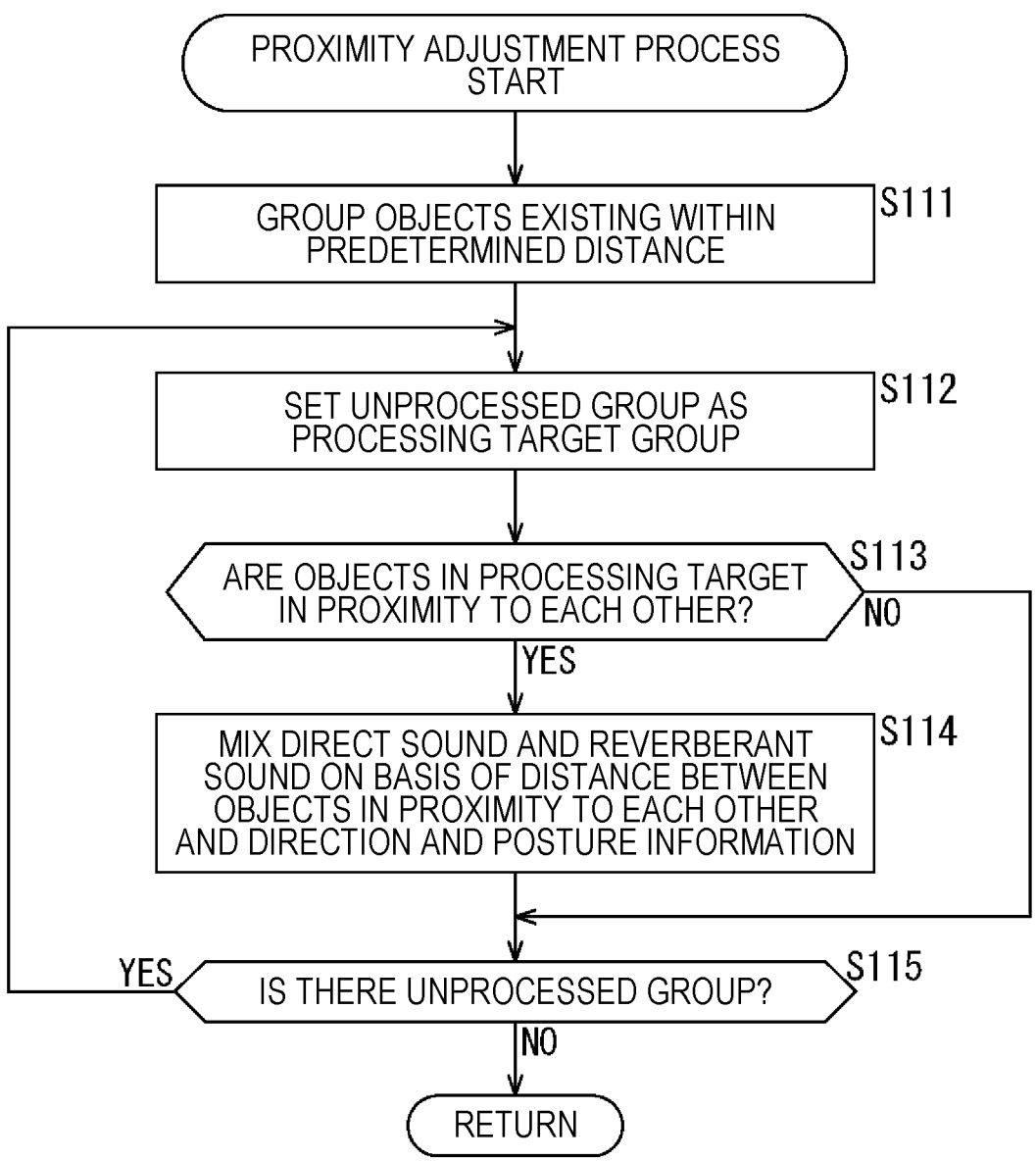
FIG. 15 is a flowchart describing a proximity adjustment process.

Here, the proximity adjustment process will be described with reference to a flowchart in FIG. 15.

In step S111, the proximity object determination 93 groups objects existing within a predetermined distance.

For example, in the case of soccer or baseball, the proximity object determination 93 divides the inside of a ground into small areas of a predetermined size. In a case where a plurality of objects is included in the same small divided area, the proximity object determination 93 groups the plurality of objects existing in the same area together into a single group, on the basis of the location information of each object. Note, however, that the small area is defined as a range wider than the occupation range of a single player as an object.

In step S112, the proximity object determination 93 sets an unprocessed group as a processing target group.

In step S113, the proximity object determination 93 determines whether or not objects in the processing target group are located in proximity to each other, on the basis of whether or not the respective occupation ranges of the objects overlap, as described with reference to FIG. 9.

In a case where the respective occupation ranges of the objects overlap and it is thus determined in step S113 that the objects are located in proximity to each other, the process proceeds to step S114.

In step S114, the proximity object determination unit 93 notifies the object mixing unit 95 of information specifying the objects considered to be in proximity to each other. As described with reference to FIG. 9, the object mixing unit 95 makes adjustment by mixing direct sounds and reverberant sounds of the objects considered to be in proximity to each other, on the basis of the distance between the objects and information on directions and postures.

Note that in a case where it is determined in step S113 that the objects are not located in proximity to each other, the processing of step S114 is skipped.

In step S115, the proximity object determination 93 determines whether or not there is an unprocessed group. In a case where there is an unprocessed group, the process returns to step S112. That is, the processing of steps S112 to S1115 is repeated until proximity determination is made for all the groups.

Then, in a case where it is determined in step S115 that there is no unprocessed group, the process ends.

That is, with the above process, proximity determination is made for objects existing in ranges in proximity to each other. In a case where objects are in proximity to each other, that is, the occupation ranges of the objects overlap, the direct sound data and the reverberant sound data of the objects are mixed on the basis of the distance between the objects and the relationship between directions and postures. Thus, the mixed data are treated as direct sound data and reverberant sound data of a single object. As a result, no excess gain or the like is caused. It is thus possible to reduce noise generation.

Figure 13:
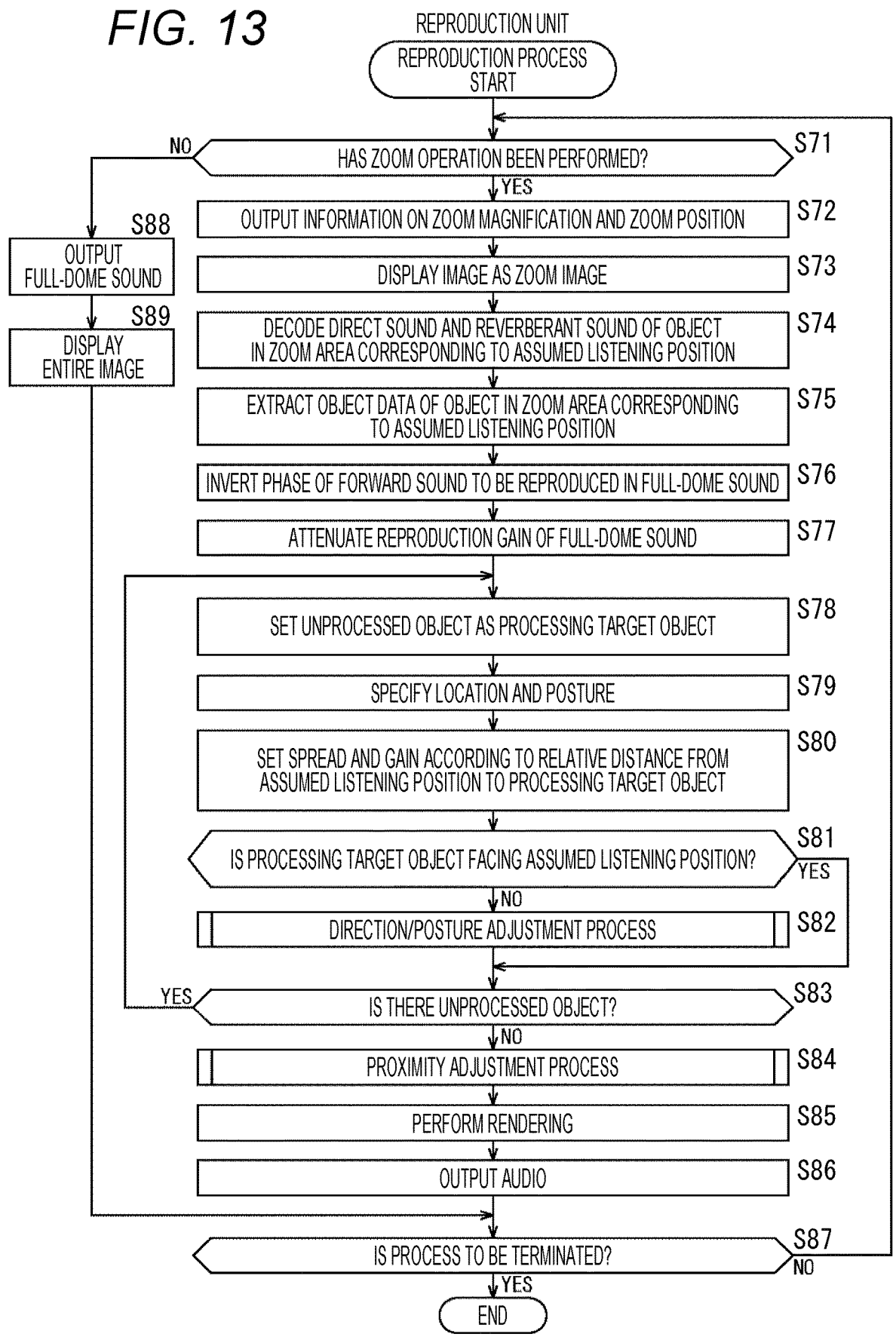
FIG. 13 is a flowchart describing a reproduction process.

Here, the description returns to the flowchart of FIG. 13.

When the proximity adjustment process ends in step S84, the process proceeds to step S85.

In step S85, the object mixing unit 95 outputs the direct sound data and the reverberant sound data of all the objects to the 3D audio renderer 97. The direct sound data and the reverberant sound data have been adjusted and subjected to the proximity adjustment process on the basis of the location information, the directions, and the postures. The 3D audio renderer 97 performs audio rendering on the basis of the direct sound data and the reverberant sound data of all the objects, the audio data of full-dome sound from the phase adjustment unit 96, and information on gain supplied from the gain adjustment unit 99. The direct sound data and the reverberant sound data have been adjusted and subjected to the proximity adjustment process on the basis of the location information, the directions, and the postures. Then, the 3D audio renderer 97 outputs the result of the audio rendering to the audio output unit 21, and causes the audio output unit 21 to output the result of the audio rendering as audio.

In step S87, it is determined whether or not an instruction to terminate the process has been given. In a case where no instruction to terminate the process has been given, the process returns to step S71, and the processing of steps S71 to S87 is repeated when a zoom operation is performed until there is given an instruction to terminate the process. Then, when it is determined in step S87 that there has been given an instruction to terminate the process, the process is terminated.

Here, the object metadata are formed in a time series in units of audio frames. Thus, a series of processes to be repeated in steps S71 to S87 is repeated in a time series in units of audio frames.

With the above process, the direct sound and the reverberant sound of objects are adaptively mixed according to the assumed viewing/listening position corresponding to a zoom image. As a result, it is possible to generate and output a sound suitable for an image displayed as the zoom image. Furthermore, the assumed viewing/listening position corresponding to the zoom image can achieve the hearing of a sound at a position that cannot actually be accessed. It is thus possible to virtually achieve experience that cannot actually be achieved.

An example in which the recording unit 12 includes the single camera 12a has been described above. However, a plurality of the cameras 12a may be used to capture images from various angles. In this case, it is possible to generate and reproduce an image corresponding to an angle from which no image has been captured, by using, for example, the images captured by the plurality of cameras 12a for interpolation. Furthermore, in a case where images at various angles can be reproduced, it is also possible to generate and output an appropriate sound corresponding to the angle of an image to be displayed, by mixing the respective direct sound and reverberant sound of objects according to an assumed viewing/listening position corresponding to the angle by a method similar to that to be used for reproducing a zoom image.

<<3. Example of Implementation by Software>>

Incidentally, the series of processes described above can be implemented by hardware, or can be implemented by software. In a case where the series of processes is implemented by software, a program included in the software is installed on a computer from a recording medium. Examples of the computer include a computer built into dedicated hardware, a general-purpose computer capable of performing various functions by installing various programs, and the like.

Figure 16:
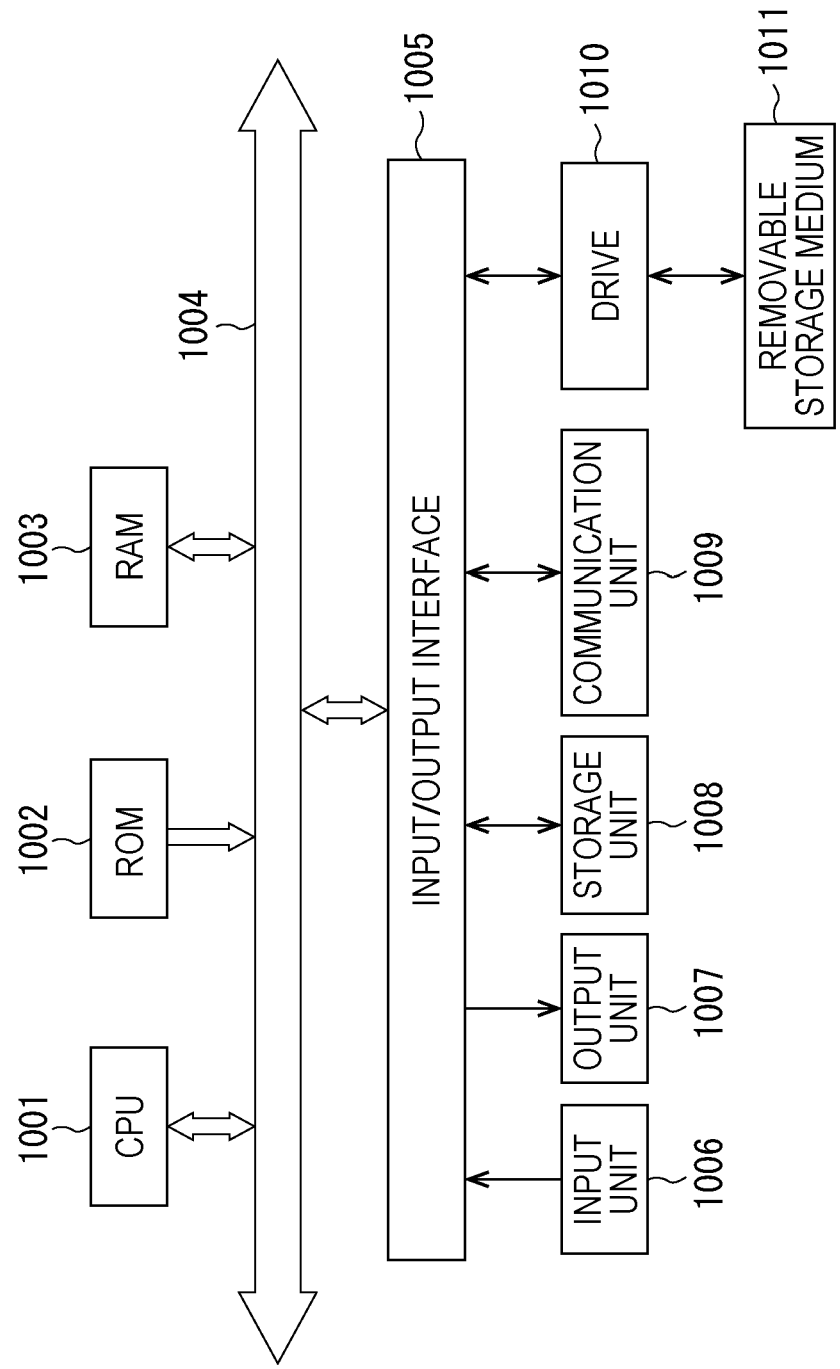
FIG. 16 is a diagram illustrating a configuration example of a general-purpose computer.

FIG. 16 shows a configuration example of a general-purpose computer. This personal computer includes a central processing unit (CPU) 1001. The CPU 1001 is connected to an input/output interface 1005 via a bus 1004. The bus 1004 is connected to a read only memory (ROM) 1002 and a random access memory (RAM) 1003.

The input/output interface 1005 is connected to an input unit 1006, an output unit 1007, a storage unit 1008, and a communication unit 1009. The input unit 1006 includes input devices, such as a keyboard and a mouse, to be used by a user to input an operation command. The output unit 1007 outputs a processing operation screen and an image of a processing result to a display device. The storage unit 1008 includes, for example, a hard disk drive that stores programs and various data, and the like. The communication unit 1009 includes a local area network (LAN) adapter and the like, and performs a communication process via a network typified by the Internet. Furthermore, the input/output interface 1005 is also connected to a drive 1010 that reads and writes data from and to a removable storage medium 1011 such as a magnetic disk (including a flexible disk), an optical disk (including a compact disc-read only memory (CD-ROM) and a digital versatile disc (DVD)), a magneto-optical disk (including a mini disc (MD)), or a semiconductor memory.

The CPU 1001 performs various processes according to programs stored in the ROM 1002 or programs read from the removable storage medium 1011 such as a magnetic disk, an optical disk, a magneto-optical disk, or a semiconductor memory, installed in the storage unit 1008, and loaded from the storage unit 1008 into the RAM 1003. The RAM 1003 also stores, as appropriate, data and the like necessary for the CPU 1001 to perform the various processes.

In the computer configured as described above, the CPU 1001 loads a program stored in, for example, the storage unit 1008 into the RAM 1003 via the input/output interface 1005 and the bus 1004, and executes the program, so that the series of processes described above is performed.

A program to be executed by the computer (CPU 1001) can be recorded on, for example, the removable storage medium 1011 as a package medium or the like, to be provided. Furthermore, the program can be provided via a wired or wireless transmission medium such as a local area network, the Internet, or digital satellite broadcasting.

In the computer, it is possible to install the program in the storage unit 1008 via the input/output interface 1005 by mounting the removable storage medium 1011 on the drive 1010. Furthermore, the program can be received by the communication unit 1009 via a wired or wireless transmission medium, to be installed in the storage unit 1008. In addition, the program can be installed in the ROM 1002 or the storage unit 1008 in advance.

Note that the program to be executed by the computer may be a program that causes processes to be performed in time sequence in accordance with the order described in the present specification. Alternatively, the program may be a program that causes processes to be performed in parallel or at necessary timing such as timing when a call is made.

Figure 6:
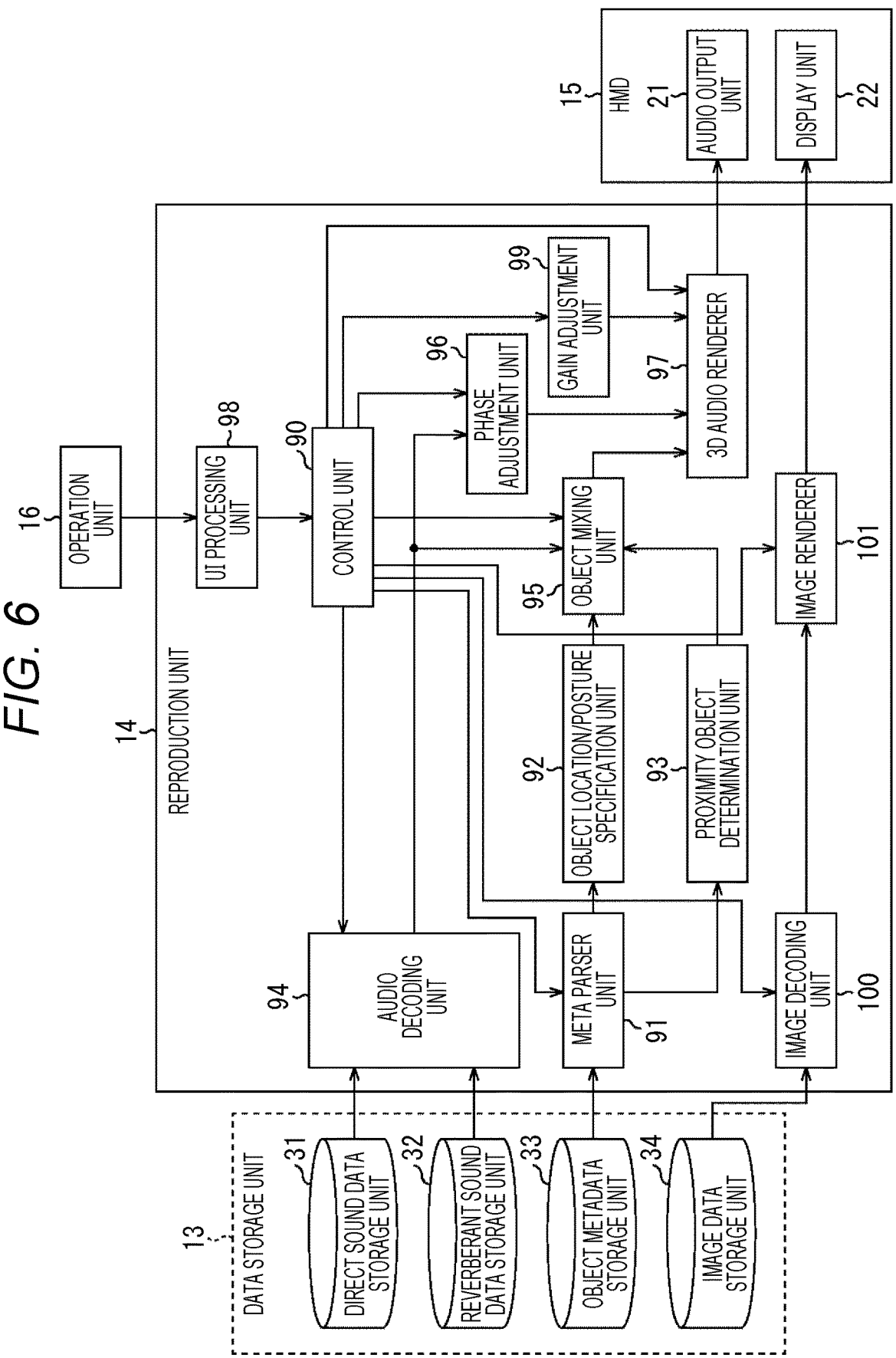
FIG. 6 is a block diagram illustrating a configuration example of a reproduction unit in FIG. 2.

Note that the CPU 1001 in FIG. 16 implements the function of the control unit 90 in FIG. 6. Furthermore, the storage unit 1008 in FIG. 16 implements the data storage unit 13 in FIG. 6.

Moreover, in the present specification, the term "system" refers to a set of multiple constituent elements (devices, modules (parts), and the like), and it does not matter whether or not all the constituent elements are in the same housing. Therefore, a plurality of devices stored in separate housings and connected via a network, and a single device including a plurality of modules stored in a single housing are both considered systems.

Note that the embodiment of the present disclosure is not limited to the above-described embodiment, and various modifications may be made without departing from the gist of the present disclosure.

For example, in the present disclosure, it is possible to adopt a configuration of cloud computing in which a plurality of devices shares a single function and performs processing in collaboration with each other via a network.

Furthermore, each step described in the above-described flowcharts can be performed by a single device, or can be shared and performed by a plurality of devices.

Moreover, in a case where a plurality of processes is included in a single step, the plurality of processes included in the single step can be performed by a single device, or can be shared and performed by a plurality of devices.

Note that the present disclosure can also adopt the following configurations.

<1> An information processing apparatus including:
an image reproduction unit that reproduces image content for which a viewing zoom magnification can be changed;
a gain adjustment unit that adjusts volume gain for audio data associated with an object in the image content, according to a viewing zoom magnification during reproduction of the image content and information on a direction that the object faces in the image content; and
an audio reproduction unit that reproduces the audio data adjusted by the gain adjustment unit together with the image content.

<2> The information processing apparatus according to <1>, in which
the gain adjustment unit adjusts the volume gain of direct sound data and reverberant sound data in the audio data.

<3> The information processing apparatus according to <2>, in which
the gain adjustment unit adjusts the volume gain by adjusting a mixing ratio of the direct sound data to the reverberant sound data in the audio data on the basis of the information on the direction that the object faces in the image content, the information being associated with the object.

<4> The information processing apparatus according to <3>, in which
when the object in the image content is not facing a viewer/listener, the gain adjustment unit adjusts the volume gain by adjusting the mixing ratio of the direct sound data to the reverberant sound data in the audio data on the basis of the information on the direction that the object faces in the image content, the information being associated with the object.

<5> The information processing apparatus according to <3>, in which
when the object in the image content is facing a viewer/listener, the gain adjustment unit adjusts the volume gain by making adjustment such that the mixing ratio of the direct sound data to the reverberant sound data in the audio data is substantially 1:0, on the basis of the information on the direction that the object faces in the image content, the information being associated with the object.

<6> The information processing apparatus according to <3>, in which
the gain adjustment unit adjusts the mixing ratio such that a proportion of the direct sound data is increased and a proportion of the reverberant sound data is reduced as the object in the image content faces a direction closer to a direction of a viewer/listener, and
the gain adjustment unit adjusts the mixing ratio such that the proportion of the direct sound data is reduced and the proportion of the reverberant sound data is increased as the object in the image content faces a direction closer to a direction opposite to the viewer/listener.

<7> The information processing apparatus according to <3>, further including:
a proximity object determination unit that determines that there is a plurality of objects in proximity to each other within a predetermined range of the image content,
in which the gain adjustment unit adjusts volume gain of audio data associated with the plurality of objects, on the basis of a result of determination made by the proximity object determination unit.

<8> The information processing apparatus according to <7>, in which
the gain adjustment unit adjusts the volume gain by adjusting mixing ratios of the direct sound data to the reverberant sound data of the respective audio data associated with the plurality of objects on the basis of the result of determination made by the proximity object determination unit, obtaining an average value of the mixing ratios of the direct sound data to the reverberant sound data, and treating the average value of the mixing ratios of the direct sound data to the reverberant sound data as a mixing ratio of the direct sound data to the reverberant sound data of audio data associated with a single object.

<9> The information processing apparatus according to <2>, in which
the direct sound data and the reverberant sound data are separated at a time of recording the audio data.

<10> The information processing apparatus according to <9>, further including:
a terminal to be attached to the object at the time of the recording,
in which the terminal includes:
an audio data detection unit that detects audio data;
a location information detection unit that detects location information; and
a direction detection unit that detects a direction that an object faces, and
the audio data detected by the audio data detection unit are separated into the direct sound data and the reverberant sound data.

<11> The information processing apparatus according to <1>, in which
a viewpoint location of the image content can be changed.

<12> The information processing apparatus according to <11>, in which
the object is an object to be displayed in a display area of the image content, the display area being determined by the viewpoint location.

<13> An information processing method including:
an image reproduction process of reproducing image content for which a viewing zoom magnification can be changed;
a gain adjustment process of adjusting volume gain for audio data associated with an object in the image content, according to a viewing zoom magnification during reproduction of the image content and information on a direction that the object faces in the image content; and
an audio reproduction process of reproducing the audio data adjusted by the gain adjustment process together with the image content.

<14> A program for causing a computer to function as:
an image reproduction unit that reproduces image content for which a viewing zoom magnification can be changed;
a gain adjustment unit that adjusts volume gain for audio data associated with an object in the image content, according to a viewing zoom magnification during reproduction of the image content and information on a direction that the object faces in the image content; and an audio reproduction unit that reproduces the audio data adjusted by the gain adjustment unit together with the image content.

REFERENCE SIGNS LIST

1 Information processing system
11, 11-1 to 11-$n$ Terminal
12 Recording unit
12$a$ Camera
12$b$ Microphone
13 Data storage unit
14 Reproduction unit
15 HMD
16 Operation unit
21 Audio output unit
22 Display unit
31 Direct sound data storage unit
32 Reverberant sound data storage unit
33 Object data storage unit
34 Image data storage unit
51 Control unit
52 Sound acquisition unit
53 GPS
54 Motion sensor
55 Communication unit
71 Control unit
72 Communication unit
73 Recorded data storage unit
74 Data separation unit
75 Noise removal unit
76 Reverberation separation unit
77 Object metadata generation unit
78 Image data extraction unit
90 Control unit
91 Meta parser unit
92 Object location/posture specification unit
93 Proximity object determination unit
94 Audio decoding
95 Object mixing unit
96 Phase adjustment unit
97 3D audio renderer
98 UI processing unit
99 Gain adjustment unit
100 Image decoding unit
101 Image renderer

The invention claimed is:

1. An information processing apparatus comprising:
an image reproduction unit that reproduces image content for which a viewing zoom magnification can be changed;
a gain adjustment unit that adjusts volume gain for audio data associated with an object in the image content, according to a viewing zoom magnification during reproduction of the image content and information on a direction that the object faces in the image content; and
an audio reproduction unit that reproduces the audio data adjusted by the gain adjustment unit together with the image content,
wherein the gain adjustment unit adjusts the volume gain of direct sound data and reverberant sound data in the audio data, and
wherein the gain adjustment unit adjusts the volume gain by adjusting a mixing ratio of the direct sound data to the reverberant sound data in the audio data on a basis of the information on the direction that the object faces in the image content, the information being associated with the object.

2. The information processing apparatus according to claim 1, wherein
when the object in the image content is not facing a viewer/listener, the gain adjustment unit adjusts the volume gain by adjusting the mixing ratio of the direct sound data to the reverberant sound data in the audio data on the basis of the information on the direction that the object faces in the image content, the information being associated with the object.

3. The information processing apparatus according to claim 1, wherein
when the object in the image content is facing a viewer/listener, the gain adjustment unit adjusts the volume gain by making adjustment such that the mixing ratio of the direct sound data to the reverberant sound data is substantially 1:0.

4. The information processing apparatus according to claim 1, wherein
the gain adjustment unit adjusts the mixing ratio such that a proportion of the direct sound data is increased and a proportion of the reverberant sound data is reduced as the object in the image content faces a direction closer to a direction of a viewer/listener, and
the gain adjustment unit adjusts the mixing ratio such that the proportion of the direct sound data is reduced and the proportion of the reverberant sound data is increased as the object in the image content faces a direction closer to a direction opposite to the viewer/listener.

5. The information processing apparatus according to claim 1, further comprising:
a proximity object determination unit that determines that there is a plurality of objects in proximity to each other within a predetermined range of the image content,
wherein the gain adjustment unit adjusts volume gain of audio data associated with the plurality of objects, on a basis of a result of determination made by the proximity object determination unit.

6. The information processing apparatus according to claim 5, wherein
the gain adjustment unit adjusts the volume gain by adjusting mixing ratios of the direct sound data to the reverberant sound data of the respective audio data associated with the plurality of objects on the basis of the result of determination made by the proximity object determination unit, obtaining an average value of the mixing ratios of the direct sound data to the reverberant sound data, and treating the average value of the mixing ratios of the direct sound data to the reverberant sound data as a mixing ratio of the direct sound data to the reverberant sound data of audio data associated with a single object.

7. The information processing apparatus according to claim 1, wherein
the direct sound data and the reverberant sound data are separated at a time of recording the audio data.

8. The information processing apparatus according to claim 7, further comprising:
a terminal to be attached to the object at the time of the recording,
wherein the terminal includes:
an audio data detection unit that detects audio data;
a location information detection unit that detects location information; and a direction detection unit that detects a direction that an object faces, and the audio data detected by the audio data detection unit are separated into the direct sound data and the reverberant sound data.

9. The information processing apparatus according to claim 1, wherein a viewpoint location of the image content can be changed.

10. The information processing apparatus according to claim 9, wherein the object is an object to be displayed in a display area of the image content, the display area being determined by the viewpoint location.

11. An information processing method comprising:

an image reproduction process of reproducing image content for which a viewing zoom magnification can be changed;

a gain adjustment process of adjusting volume gain for audio data associated with an object in the image content, according to a viewing zoom magnification during reproduction of the image content and information on a direction that the object faces in the image content; and an audio reproduction process of reproducing the audio data adjusted by the gain adjustment process together with the image content, wherein in the gain adjustment process, an adjustment is made to the volume gain of direct sound data and reverberant sound data in the audio data, by adjusting a mixing ratio of the direct sound data to the reverberant sound data in the audio data on a basis of the information on the direction that the object faces in the image content, the information being associated with the object.

12. A non-transitory computer-readable medium having embodied thereon a program, which when executed by a computer causes the computer to execute a method, the method comprising:

an image reproduction process of reproducing image content for which a viewing zoom magnification can be changed;

a gain adjustment process of adjusting volume gain for audio data associated with an object in the image content, according to a viewing zoom magnification during reproduction of the image content and information on a direction that the object faces in the image content; and an audio reproduction process of reproducing the audio data adjusted by the gain adjustment process together with the image content, wherein in the gain adjustment process, an adjustment is made to the volume gain of direct sound data and reverberant sound data in the audio data, by adjusting a mixing ratio of the direct sound data to the reverberant sound data in the audio data on a basis of the information on the direction that the object faces in the image content, the information being associated with the object.

* * * * *